US007968786B2

(12) United States Patent
Kemmochi et al.

(10) Patent No.: US 7,968,786 B2
(45) Date of Patent: Jun. 28, 2011

(54) VOLUME ADJUSTING APPARATUS AND VOLUME ADJUSTING METHOD

(75) Inventors: Chisato Kemmochi, Kanagawa (JP); Shiro Suzuki, Kanagawa (JP); Shusuke Takahashi, Chiba (JP)

(73) Assignee: Sony Corporation, Tokyo (JP)

( * ) Notice: Subject to any disclaimer, the term of this patent is extended or adjusted under 35 U.S.C. 154(b) by 93 days.

(21) Appl. No.: 12/497,913

(22) Filed: Jul. 6, 2009

(65) Prior Publication Data

US 2010/0005953 A1 Jan. 14, 2010

(30) Foreign Application Priority Data

Jul. 8, 2008 (JP) ................................. 2008-177934

(51) Int. Cl.
*G10H 1/00* (2006.01)
(52) U.S. Cl. ................................ 84/621; 84/663; 84/665
(58) Field of Classification Search ............ 84/600–602, 84/621, 633, 665
See application file for complete search history.

(56) References Cited

U.S. PATENT DOCUMENTS

| | | | | |
|---|---|---|---|---|
| 5,434,922 A * | 7/1995 | Miller et al. | ..................... | 381/57 |
| 5,450,494 A * | 9/1995 | Okubo et al. | ..................... | 381/57 |
| 5,615,270 A * | 3/1997 | Miller et al. | ..................... | 381/57 |
| 5,666,426 A * | 9/1997 | Helms | ............................. | 381/57 |
| 5,790,671 A * | 8/1998 | Cooper | ........................... | 381/57 |
| 5,844,992 A * | 12/1998 | Boyer | ............................. | 381/57 |
| 5,872,852 A * | 2/1999 | Dougherty | ..................... | 381/57 |
| 5,907,622 A * | 5/1999 | Dougherty | ..................... | 381/57 |
| 6,529,605 B1 * | 3/2003 | Christoph | ....................... | 381/56 |
| 6,584,201 B1 * | 6/2003 | Konstantinou et al. | ......... | 381/57 |
| 6,868,162 B1 * | 3/2005 | Jubien et al. | .................. | 381/107 |
| 7,177,433 B2 | 2/2007 | Sibbald | | |
| 7,302,062 B2 * | 11/2007 | Christoph | ....................... | 381/57 |
| 7,467,020 B2 * | 12/2008 | Ku | ................................ | 700/94 |
| 7,760,893 B1 * | 7/2010 | Felber | ........................... | 381/104 |
| 2009/0245537 A1 * | 10/2009 | Morin | ........................... | 381/107 |
| 2010/0005953 A1 * | 1/2010 | Kemmochi et al. | ............. | 84/633 |
| 2010/0061560 A1 * | 3/2010 | Cronin | ........................... | 381/57 |

FOREIGN PATENT DOCUMENTS

| | | |
|---|---|---|
| JP | 04-123598 | 4/1992 |
| JP | 04-278796 | 10/1992 |
| JP | 05-049091 | 2/1993 |
| JP | 06-006156 | 1/1994 |
| JP | 03-247098 A | 11/1997 |
| JP | 2003-526122 A | 9/2003 |
| JP | 2004-297304 A | 10/2004 |
| JP | 2007-043231 | 2/2007 |
| JP | 2007-088521 A | 4/2007 |
| JP | 2007-097087 A | 4/2007 |
| JP | 2008-072677 A | 3/2008 |

* cited by examiner

*Primary Examiner* — David S. Warren
(74) *Attorney, Agent, or Firm* — Wolf, Greenfield & Sacks, P.C.

(57) ABSTRACT

A volume adjusting apparatus includes a sound collecting unit configured to collect noise data of a surrounding environment, an analyzing unit configured to extract a feature value indicating a feature of the noise data collected by the sound collecting unit and a feature value indicating a feature of supplied musical tune data, and a control unit configured to generate volume adjustment information for adjusting playback volume of the musical tune data based on the feature value of the noise data and the feature value of the musical tune data and adjusts the playback volume of the musical tune data based on the volume adjustment information.

12 Claims, 17 Drawing Sheets

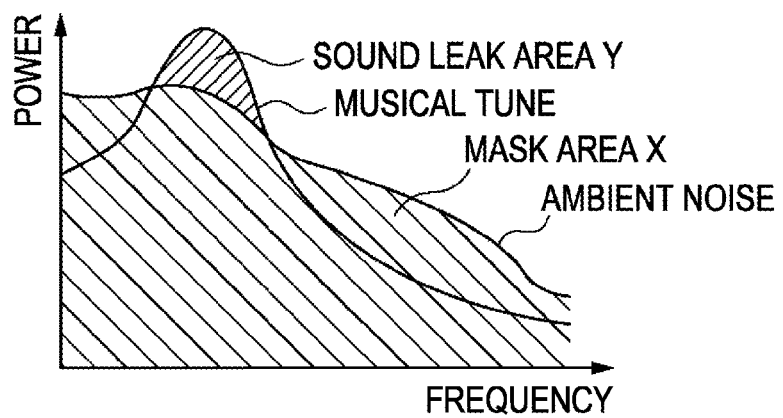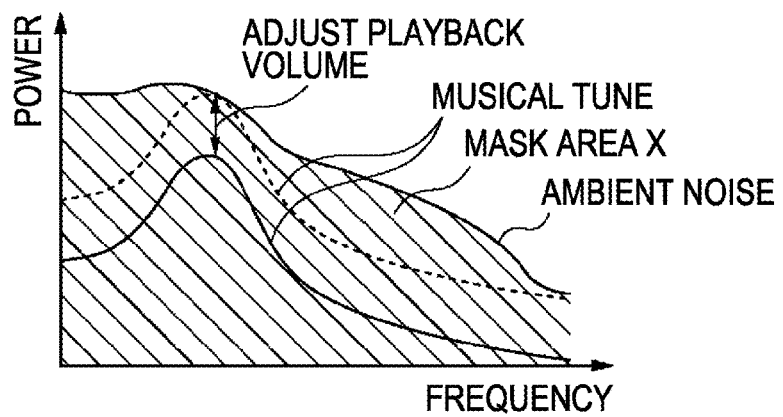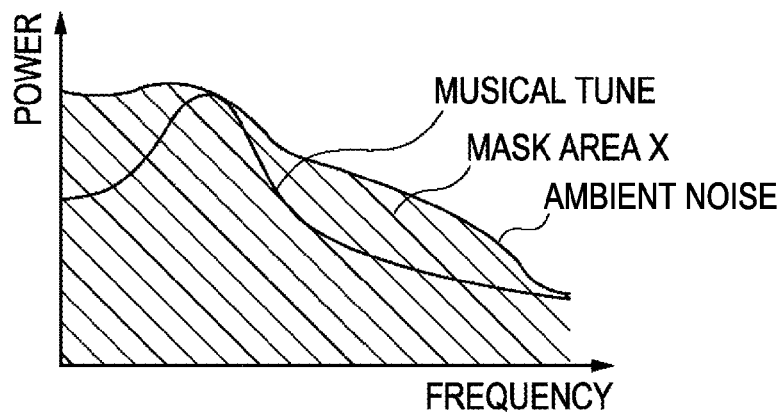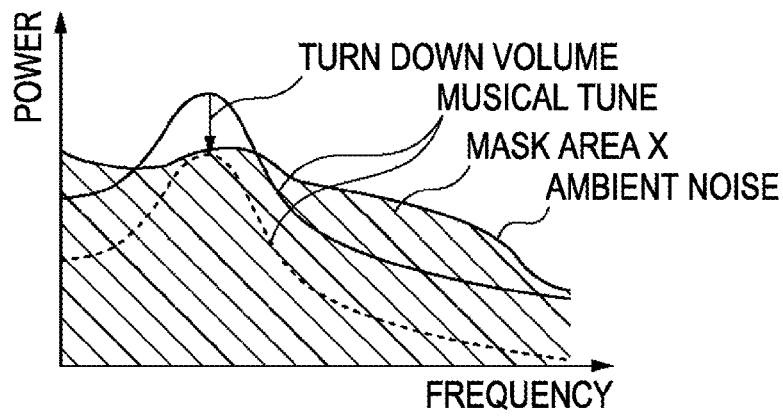

VOLUME ADJUSTING APPARATUS AND VOLUME ADJUSTING METHOD

BACKGROUND OF THE INVENTION

1. Field of the Invention

The present invention relates to a volume adjusting apparatus and a volume adjusting method for preventing sound leakage.

2. Description of the Related Art

Recently, portable playback apparatuses capable of play back musical tunes outside the home or outdoors have been widely used. As shown in FIG. 16, a headphone 102 is connected to a playback apparatus 101 according to the related art. A user listens to a musical tune recorded in the playback apparatus 101 through the headphone 102. The playback apparatus 101 has an operation unit for starting and stopping playback of a musical tune and for volume adjustment. The user operates the operation unit, thereby being able to adjust the playback volume of the musical tune.

For example, when a user plays back a musical tune in a "running" train using such a playback apparatus, the user operates the operation unit to turn up the volume so that the user can appropriately listen to the musical tune since ambient noise is loud. When the train "stops", the user turns down the volume since the ambient noise becomes smaller than that generated when the train is "running".

A playback method of the playback apparatus 101 according to the related art will be described with reference to a flowchart shown in FIG. 17. At STEP S101, the playback apparatus 101 is turned ON. At STEP S102, a musical tune recorded in the playback apparatus 101 is played back.

At STEP S103, whether to adjust the volume is determined. For example, when the musical tune is hardly heard due to the ambient noise and it is determined that the volume is to be adjusted, the process proceeds to STEP S104. At STEP S104, the user operates the operation unit to set the volume. If it is determined that the volume is not to be adjusted, the process proceeds to STEP S105.

At S105, whether the user continues to listen to the musical tune is determined. If it is determined that the user continues to listen to the musical tune, the process returns to STEP S102. At STEP S102, playback of the musical tune is continued. If it is determined that the user does not continue to listen to the musical tune, the process proceeds to STEP S106. At STEP S106, the playback apparatus 101 is turned OFF. The process then terminates.

As described above, in the playback apparatus according to the related art, the user recognizes the surrounding ambient noise and manually adjusts the volume based on the recognition so that the user can appropriately listen to a musical tune.

However, when the volume is adjusted manually in such a manner, sound leakage from a headphone may disturb people around the user depending on the set volume because the user may set the volume so that the user is no longer disturbed by the ambient noise or the user has difficulty recognizing sound leaking to the surrounding environment.

In particular, sound leakage is problematic at places, such as in a train or a bus, where the ambient noise level significantly changes. For example, when a train or a bus is "running", a user turns up the volume in accordance with the ambient noise since the ambient noise is loud. At this point, sound leakage is hardly recognized by people around the user. However, when the train or the bus "stops" with the volume being kept at the same level, the sound leakage is more likely to be recognized since the ambient noise becomes smaller than that generated when the train or the bus is running.

When the train or the bus is "not running", the user turns down the volume in accordance with the ambient noise since the ambient noise is smaller than that generated when the train or the bus is "running". Accordingly, the sound leaking to the surrounding environment is hardly recognized. However, when the train or the bus starts "running", it is difficult to listen to a musical tune since the ambient noise becomes louder.

In addition, when a user moves to a quiet place, such as a coffee shop, from a loud place, such as a crowded place, where occurrence of sound leakage is hardly recognized by people around the user, the sound leakage is more likely to be recognized by the people around the user.

Furthermore, even if the ambient noise level does not change, sound leakage may occur when a recorded sound level or a music genre that a user is listening to changes in response to a change of musical tunes. For example, a case where a musical tune that the user is listening to while a train or a bus is "running" changes from a quiet musical tune that may be categorized into "classical music" to a musical tune that may be categorized into "rock music" will be discussed. In such a case, the user listens to the "classical music" at a high volume level in accordance with the ambient noise. Since the recorded sound level and the music genre significantly change in response to a change of a musical tune to "rock music", the user may hurt their ears or people around the user may be more likely to recognize sound leakage.

As described above, when the ambient noise changes or when the playback volume or the genre of a musical tune currently being played back changes, the user adjusts the volume in response to the change in the ambient noise or the musical tune to prevent sound leakage.

Accordingly, recently, a technique, such as an automatic volume limiter system (AVLS), for monitoring a state of a reproduced audio signal and adjusting the volume so that the audio signal level does not exceed a predetermined upper limit has been put to practical use to prevent sound from leaking to the surrounding environment. For example, Japanese Unexamined Patent Application Publication No. 5-49091 discloses a technique for detecting a middle and high audio signal level of an audio signal and adjusting the volume to prevent sound leakage by suppressing the signal level based on the detection result.

SUMMARY OF THE INVENTION

However, a method disclosed in Japanese Unexamined Patent Application Publication No. 5-49091 can prevent sound leakage in an environment where an ambient noise level is substantially constant. However, when the ambient noise is not substantially constant but changes or when an environment changes due to movement of a user, it may be difficult to follow the change with the method disclosed in Japanese Unexamined Patent Application Publication No. 5-49091.

For example, when the ambient noise level changes, sound leakage may not be detected even if a user sets the signal level to the volume exceeding the upper limit or sound leakage may be detected even if the user sets the signal level to the volume not exceeding the upper limit depending on a state of the ambient noise.

A method for collecting external sound, such as ambient noise, and adding a component for canceling the external sound to reproduced sound to reduce the ambient noise has also been put to practical use as is seen in a playback apparatus including a noise canceling headphone. By reducing the ambient noise, a user can appropriately listen to a musical tune at a lower volume level.

However, in such a case, it is possible to prevent the user from having difficulty listening to reproduced sound to some extent by reducing the ambient noise that can be heard by the user. However, depending on kinds of the ambient noise, a sufficient effect of reduction of the ambient noise may not be obtained.

When a user manually adjusts playback volume, the user has to operate, for example, an operation unit of a playback apparatus. Accordingly, every time the ambient noise level changes, the user has to operate the operation unit. Furthermore, with miniaturization of a playback apparatus, the operation unit of the playback apparatus is also miniaturized. Accordingly, an operation for adjusting the playback volume is very troublesome undesirably.

It is desirable to provide a volume adjusting apparatus and a volume adjusting method that can automatically adjust playback volume to a level suitable for ambient noise and prevent sound leakage.

According to an embodiment of the present invention, a volume adjusting apparatus includes a sound collecting unit configured to collect noise data of a surrounding environment, an analyzing unit configured to extract a feature value indicating a feature of the noise data collected by the sound collecting unit and a feature value indicating a feature of supplied musical tune data, and a control unit configured to generate volume adjustment information for adjusting playback volume of the musical tune data based on the feature value of the noise data and the feature value of the musical tune data and adjust the playback volume of the musical tune data based on the volume adjustment information.

According to another embodiment of the present invention, a volume adjusting method includes the steps of collecting noise data of a surrounding environment, extracting a feature value indicating a feature of the collected noise data and a feature value indicating a feature of supplied musical tune data, and generating volume adjustment information for adjusting playback volume of the musical tune data based on the feature value of the noise data and the feature value of the musical tune data and adjusting the playback volume of the musical tune data based on the volume adjustment information.

As described above, according to the embodiments of the present invention, ambient noise data is collected. A feature value indicating a feature of the collected noise data and a feature value indicating a feature of supplied musical tune data are extracted. Volume adjustment information for adjusting playback volume of the musical tune data is generated based on the feature value of the noise data and the feature value of the musical tune data. The playback volume of the musical tune data is adjusted based on the volume adjustment information. Accordingly, the playback volume of the musical tune is adjusted appropriately relative to the ambient noise.

According to embodiments of the present invention, feature values are extracted from ambient noise data collected by a sound collecting unit and musical tune data recorded on a recording medium. Playback volume of the musical tune data is adjusted based on the extracted feature values of the ambient noise data and the musical tune data. Accordingly, a user can appropriately listen to a musical tune without adjusting the volume and sound leakage to a surrounding environment can be prevented advantageously.

BRIEF DESCRIPTION OF THE DRAWINGS

FIGS. 2A-2D are diagrams showing example frequency characteristics of ambient noise and a musical tune that leaks to outside through a headphone;

DESCRIPTION OF THE PREFERRED EMBODIMENTS

Embodiments of the present invention will be described below with reference to the accompanying drawings. In embodiments of the present invention, ambient noise is collected with a microphone connected to a playback apparatus. The collected ambient noise is analyzed to extract a feature value. A musical tune recorded in the playback apparatus is also analyzed to extract a feature value. Playback volume is automatically adjusted to an appropriate level for the ambient noise based on the extracted feature values of the ambient noise and the musical tune.

Figure 1:
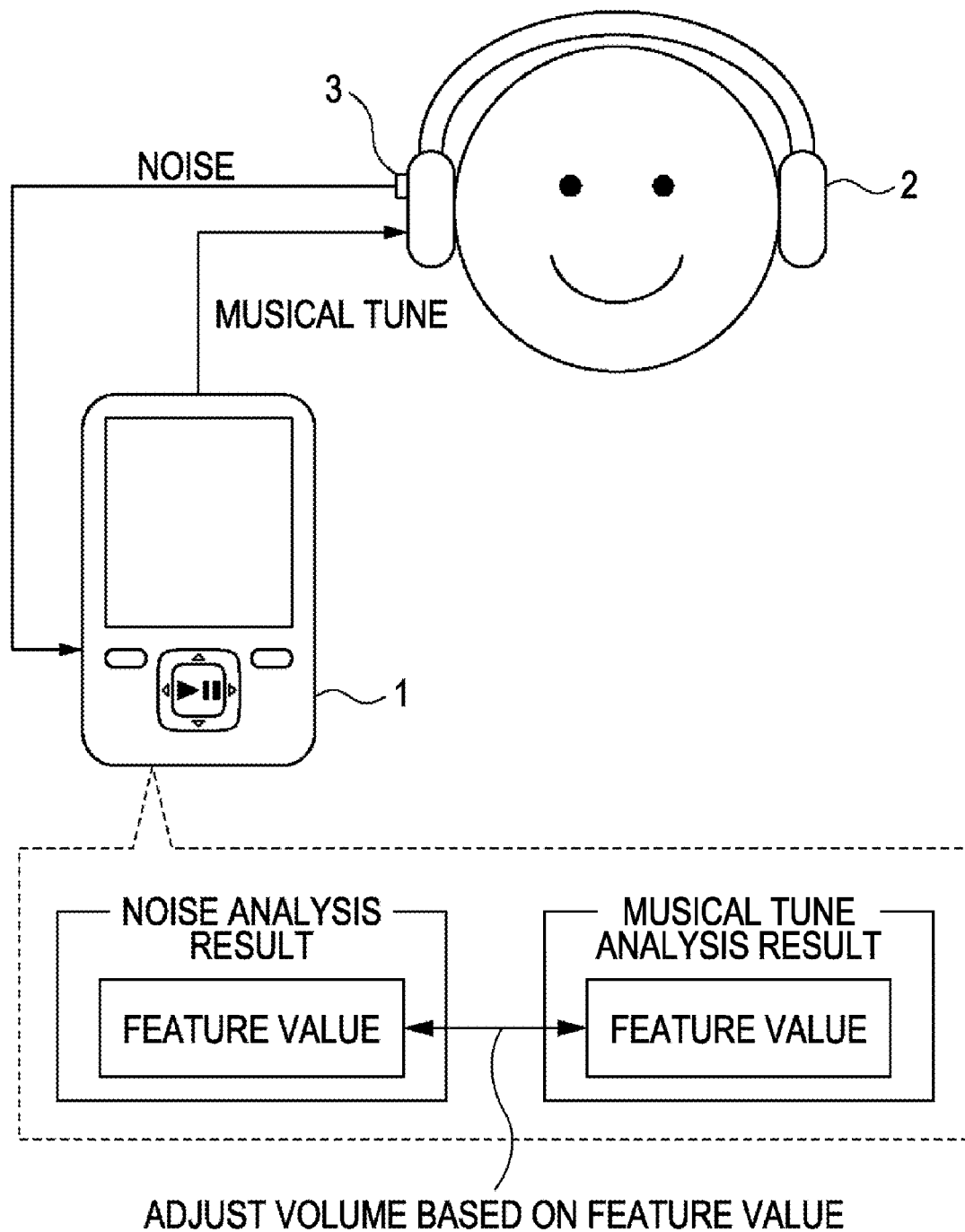
FIG. 1 is a schematic diagram showing a usage example of a playback apparatus according to a first embodiment of the present invention.

A first embodiment of the present invention will be described. FIG. 1 shows a usage example of a playback apparatus 1 according to the first embodiment of the present invention. In the example shown in FIG. 1, a headphone 2 and a microphone 3 (hereinafter, abbreviated as a MIC 3) are connected to the playback apparatus 1, such as a portable music playback apparatus. FIG. 1 shows a state where a user listens to a musical tune recorded in the playback apparatus 1 through the headphone 2. The MIC 3 is provided outside of the headphone 2. The MIC 3 collects ambient noise that can be heard at positions of user's ears when the user puts on the headphone 2. The MIC 3 may be provided inside of the headphone 2 or may be included in the playback apparatus 1.

If the user instructs the playback apparatus 1 to automatically adjust playback volume, the playback apparatus 1 analyzes ambient noise data collected by the MIC 3 to extract a feature value. The playback apparatus 1 also analyzes musical tune data that the user has instructed to play from musical tunes previously recorded in the playback apparatus 1 to extract a feature value. By comparing the feature value of the ambient noise with the feature value of the musical tune, the playback apparatus 1 sets the playback volume to a level at which sound leakage is not recognized.

For ease of understanding of the first embodiment of the present invention, occurrence of sound leakage will now be schematically described. An audio signal of a musical tune that is output from the headphone 2 passes through the headphone 2 and leaks to the outside. In such a manner, sound leakage occurs. At this time, the audio signal of the musical tune output from the headphone 2 leaks to the outside with the level of the audio signal being attenuated by the headphone 2.

FIGS. 2A-2D show example frequency characteristics of ambient noise and a musical tune that leaks to the outside through the headphone 2. Referring to FIGS. 2A-2D, the horizontal axis represents frequency, whereas the vertical axis represents power at each frequency. An area enclosed by an envelope of the ambient noise corresponds to a mask area X. Since musical tune data included in the mask area X is masked by the ambient noise, the musical tune data is not recognized as sound leakage by surrounding people.

In general, when power at a predetermined frequency component of a musical tune is larger than power of the ambient noise, sound leakage is recognized. For example, in the example shown in FIG. 2A, an area Y (hereinafter, referred to as a sound leak area Y) of an area enclosed by an envelope of the musical tune that is located outside of the mask area X exists. In this case, a component of the sound leak area Y is not masked by the ambient noise. Thus, the component of the sound leak area Y of the musical tune data is recognized as sound leakage by surrounding people.

Accordingly, as shown in FIG. 2B, sound leakage can be prevented by adjusting the volume of the musical tune so that each frequency component of the musical tune that leaks to the outside of the headphone 2 is included in the mask area X of the ambient noise.

For example, a case where the ambient noise changes from a state shown in FIG. 2C to a state shown in FIG. 2D will be discussed. In the example shown in FIG. 2C, each frequency component of the musical tune exists within the mask area X of the ambient noise, whereas some of the frequency components of the musical tune exist outside of the mask area X in the example shown in FIG. 2D. In such a case, sound leakage can be prevented by turning down the playback volume of the musical tune in accordance with a change in the ambient noise. Since the ambient noise level often decreases when the ambient noise becomes quiet, a user is less likely to have difficulty listening to the musical tune even if the playback volume is turned down.

Feature values extracted from ambient noise and a musical tune will now be described. The ambient noise differs depending on an environment, such as in a train or a bus or at a coffee shop. The ambient noise has different characteristics depending on the environment, as in a case where the volume is high at a low audio frequency or a high audio frequency, for example.

Figure 3A:
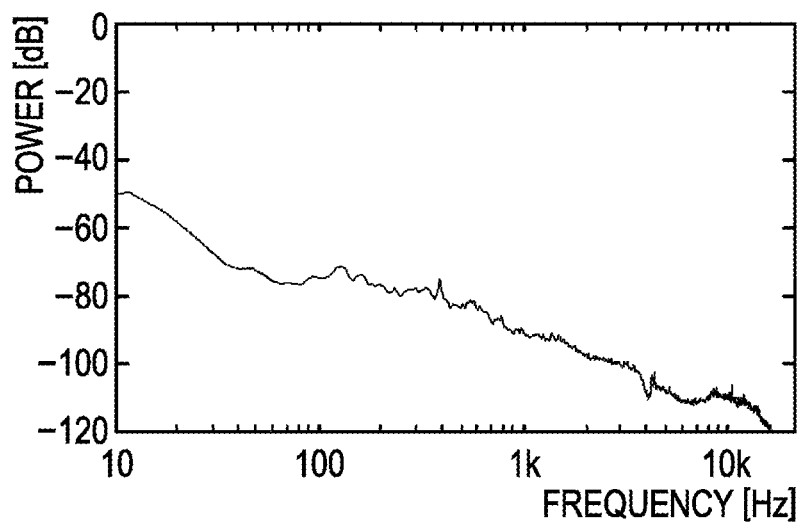
FIGS. 3A-3C are diagrams showing example frequency characteristics of ambient noise.
Figure 3B:
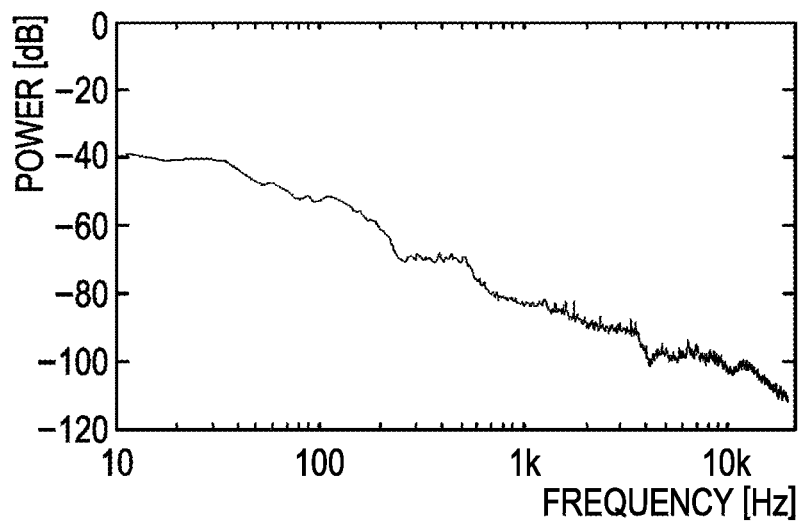
Figure 3C:
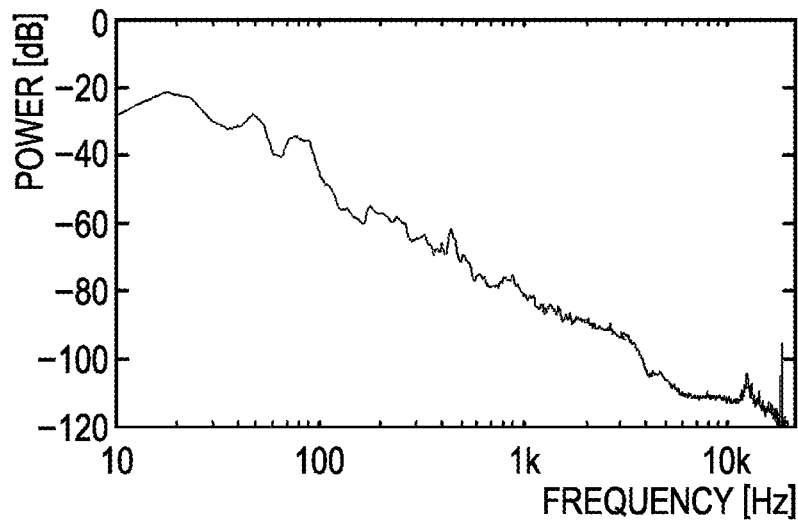

FIGS. 3A, 3B, and 3C show example frequency characteristics of ambient noise collected at a "coffee shop", in a "train", and in a "bus", respectively. The examples show frequency characteristics obtained by performing frequency analysis on appropriately 0.5-second time data of the collected ambient noise using fast Fourier transform (FFT). Referring to FIGS. 3A-3C, the horizontal axis represents frequency [Hz], whereas the vertical axis represents power [dB]. FIGS. 3A-3C show that the power values at each frequency significantly differ in various environments.

When x analysis-target time-data samples are used in frequency analysis using FFT, x/2 pieces of frequency data are obtained as power values. Frequency resolution is set to be high to increase accuracy of analysis of ambient noise. Accordingly, the number of samples is set to a certain large value. For example, when the number of time-data samples is equal to 32768, 16384 pieces of frequency data are obtained.

For example, data at each frequency can be used as a feature value based on the frequency characteristic of the ambient noise obtained in this manner. However, when 16384 pieces of frequency data are used as the feature values of the ambient noise, processing takes long time since the number of pieces of data is vast. In addition, since the pieces of frequency data change significantly as time passes, the use of the 16384 pieces of frequency data is not practical.

Figure 4A:
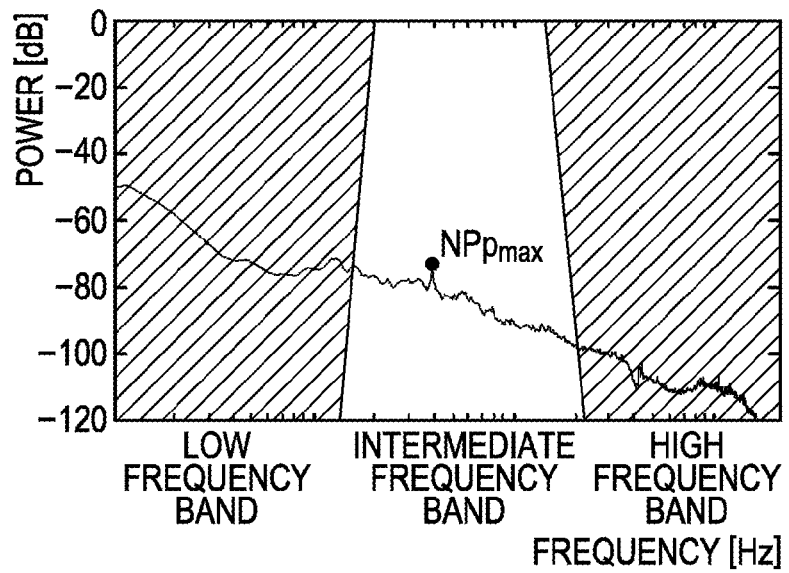
FIGS. 4A-4C are diagrams for illustrating feature values of ambient noise.
Figure 4B:
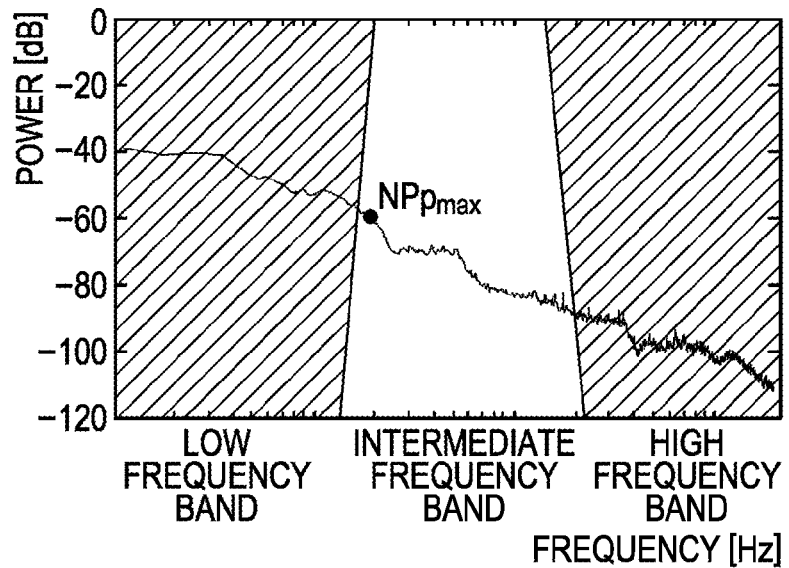
Figure 4C:
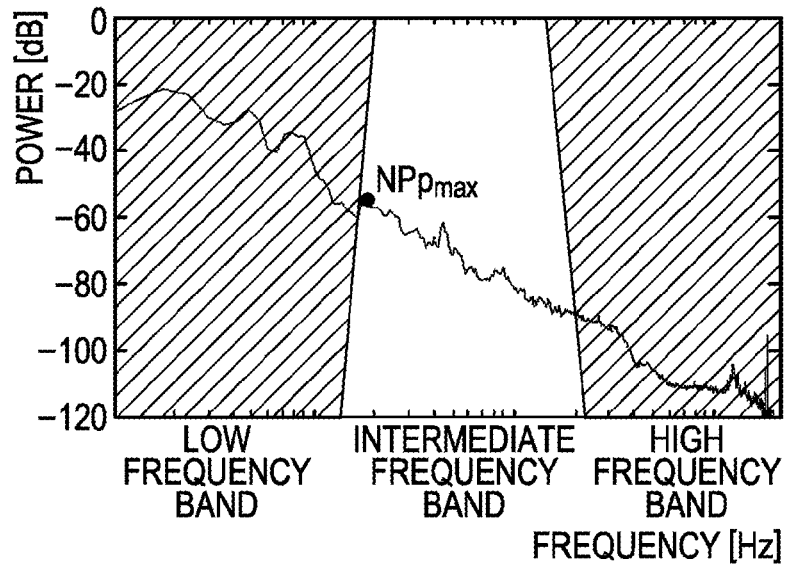

In general, sound components that are recognized as sound leakage are components of a specific frequency band, such as an intermediate frequency band, of an audio frequency band. Thus, for example, as shown in FIGS. 4A, 4B, and 4C, signal components of a specific frequency band are extracted in the first embodiment of the present invention. A maximum power value of the specific frequency band is then extracted as a feature value of the ambient noise.

Regarding a musical tune, signal components of the same frequency band as the frequency band, from which the signal components of the ambient noise are extracted, among a frequency band of the musical tune, are extracted. A maximum power value of the specific frequency band is extracted as a feature value of the musical tune.

Playback volume of the musical tune is adjusted based on the maximum power values of the ambient noise and the musical tune extracted in such a manner so that the maximum power value of the musical tune does not exceed the maximum power value of the ambient noise, whereby sound leakage can be prevented.

The feature values extracted from the ambient noise and the musical tune are not limited to the above-described examples. Various kinds of information that can be obtained from analysis may be used as the feature values. For example, average volume, a frequency spectrum, an autocorrelation coefficient, a zero crossing rate, power, a transient characteristic, sharpness, loudness, the centroid of spectra, the Mel frequency cepstrum coefficient (MFCC), sone, and a cepstrum may be used as the feature values.

Furthermore, time-axis data may be divided for every predetermined number of samples, e.g., every N samples called frames, to extract a feature value in units of frames. A ratio of a frame to the previous frame or a difference between these frames may be used as the feature value. An average or variance obtained from feature values of several frames may be used as the feature value.

A method for adjusting playback volume in accordance with ambient noise will be described. When the playback volume of a musical tune is adjusted in the first embodiment of the present invention, occurrence of sound leakage is determined based on feature values of the ambient noise residing outside of the headphone 2 and components of the musical tune that leak to the outside of the headphone 2.

Figure 5:
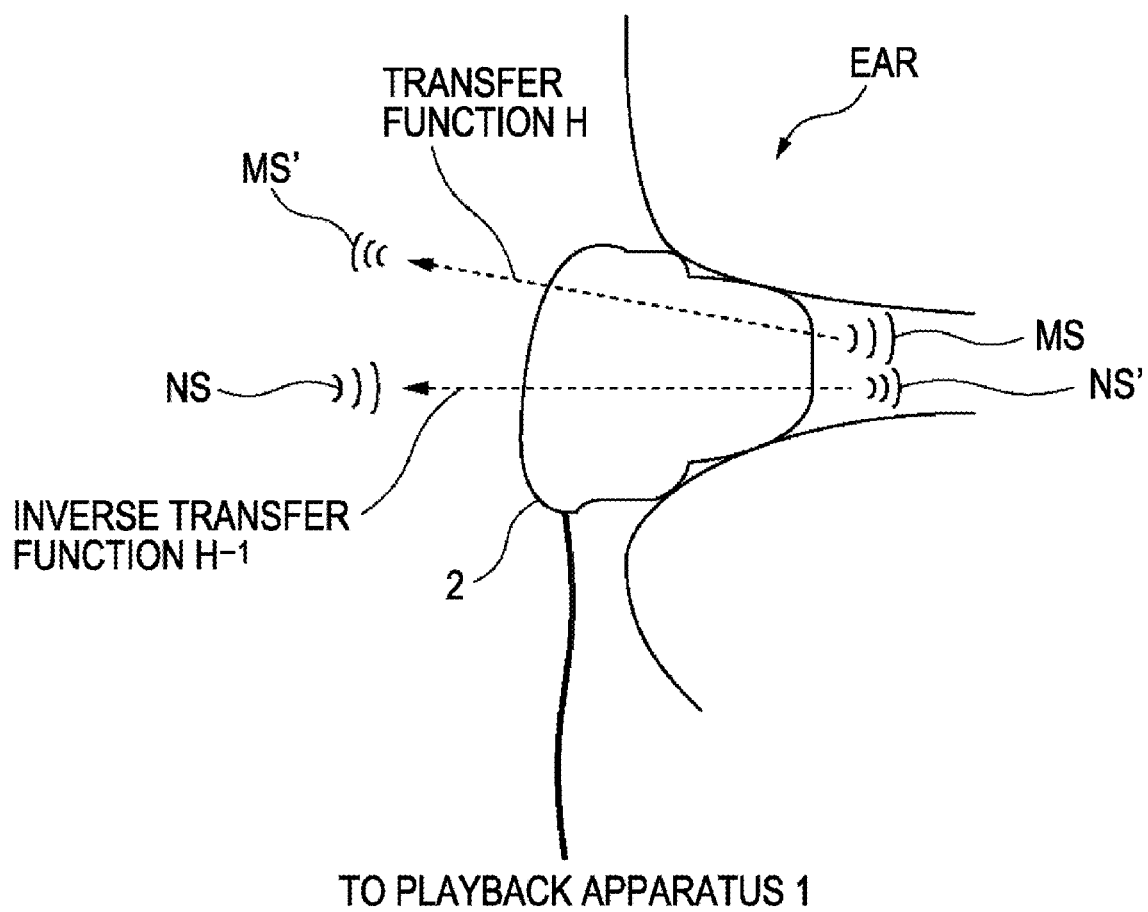
FIG. 5 is a schematic diagram for illustrating ambient noise and a musical tune signal.

As shown in FIG. 5, a musical tune signal component MS output from the headphone 2 is attenuated by the headphone 2 as it passes through the headphone 2. Part of the musical tune signal component MS leaks to the outside as a sound leak signal component MS'. An ambient noise signal component NS residing outside is attenuated by the headphone 2 as it passes through the headphone 2. Part of the ambient noise signal component NS reaches inside of a user's ear as a signal component NS'.

At this time, the signal components MS' and NS' that are the attenuated signal components MS and NS, respectively, can be estimated using a transfer function H based on a transmission characteristic of the headphone 2. More specifically, the sound leak signal component MS' of the musical tune leaking to the outside can be calculated by convolution of the transfer function H onto the musical tune signal component MS. The signal component NS' reaching inside of the user's ear can be calculated by convolution of the transfer function H onto the ambient noise signal component NS. That is, the ambient noise signal component NS can be calculated by convolution of an inverse transfer function $H^{-1}$ onto the signal component NS' reaching inside of the user's ear.

When ambient noise is collected with the microphone 3, kinds of the ambient noise to be collected differ depending on a position of the microphone 3. For example, when the microphone 3 is provided outside of the headphone 2, the ambient noise signal component to be collected is the ambient noise signal component NS residing the outside. On the other hand, when the microphone 3 is provided inside of the headphone 2, the ambient noise signal component to be collected is the signal component NS', which is the external ambient noise that is attenuated by the headphone 2 as it passes through the headphone 2.

Accordingly, when the microphone 3 is provided outside of the headphone 2, a feature value of the ambient noise residing outside of the headphone 2 can be accurately extracted since the collected ambient noise signal component NS is handled. However, when the microphone 3 is provided inside of the headphone 2, the feature value of the ambient noise residing outside of the headphone 2 is not accurately extracted if the collected ambient noise signal component NS' is handled as it is.

In the first embodiment of the present invention, when the microphone 3 is provided inside of the headphone 2, the ambient noise signal component NS is estimated from the collected ambient noise signal component NS'. The feature value is extracted based on the estimated ambient noise signal component NS.

Figure 6:
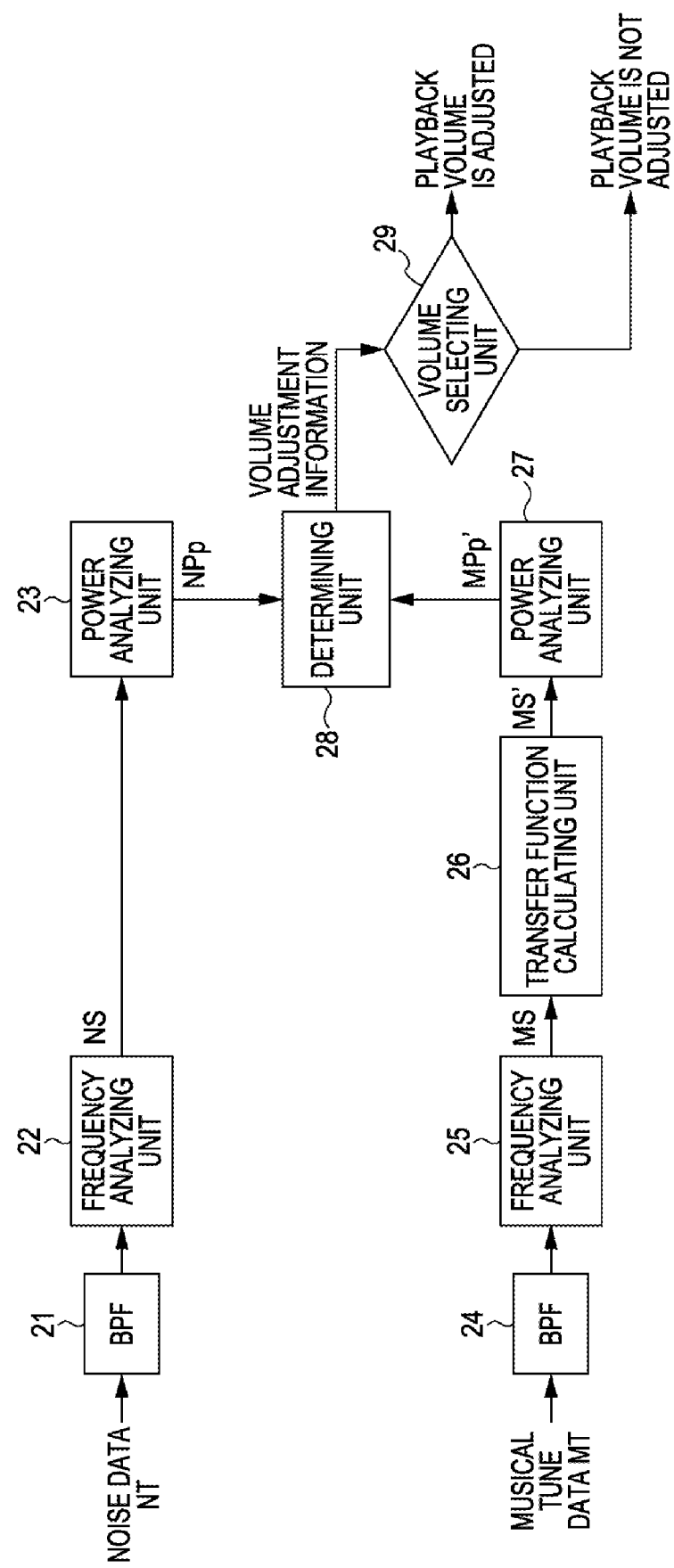
FIG. 6 is a block diagram for illustrating an example method for adjusting playback volume in accordance with ambient noise employed when a microphone is provided outside of a headphone.

Referring to FIG. 6, a method for adjusting playback volume employed when the microphone 3 is provided outside of the headphone 2 will be described. Noise data NT of ambient noise collected by the microphone 3 is supplied to a bandpass filter 21. The bandpass filter 21 extracts a predetermined frequency component, such as an intermediate frequency component, from the noise data NT and supplies the extracted frequency component to a frequency analyzing unit 22.

The frequency analyzing unit 22 performs frequency analysis, such as FFT analysis or Octave analysis, on the noise data NT using noise data of the supplied noise data NT having predetermined time duration, e.g., short time duration of 0.5 seconds or so, to obtain frequency information NS. The obtained frequency information NS is supplied to a power analyzing unit 23.

The power analyzing unit 23 performs power analysis at the predetermined frequency band of the noise data NT based on the supplied frequency information NS. In the first embodiment of the present invention, the power analyzing unit 23 calculates, for example, power information NPp, which is a predetermined numeric value of the power at the predetermined frequency band. In this example, a maximum power value NPpmax at the predetermined frequency band is used as the power information NPp, for example. The calculated power information NPp is supplied to a determining unit 28.

On the other hand, musical tune data MT of a musical tune recorded in the playback apparatus 1 is supplied to a bandpass filter 24. The bandpass filter 24 extracts a predetermined frequency component, such as an intermediate frequency component, from the musical tune data MT and supplies the extracted frequency component to a frequency analyzing unit 25.

The frequency analyzing unit 25 performs frequency analysis, such as FFT analysis or Octave analysis, on the musical tune data MT using musical tune data of the supplied musical tune data MT having predetermined time duration, e.g., short time duration of 0.5 seconds or so, to obtain frequency information MS. The obtained frequency information MS is supplied to a transfer function calculating unit 26.

The transfer function calculating unit 26 performs convolution of a predetermined transfer function H on the frequency information MS supplied from the frequency analyzing unit 25 and outputs frequency information MS', which corresponds to the musical tune data MT' that leaks to the outside of the headphone 2.

A power analyzing unit 27 performs power analysis at the predetermined frequency band of the musical tune data MT based on the supplied frequency information MS' to calculate, for example, power information MPp', which is a predetermined numeric value of the power at the predetermined frequency band. In this example, a maximum power value MPpmax' at the predetermined frequency band is used as the power information MPp', for example. The calculated power information MPp' is supplied to the determining unit 28.

The determining unit 28 determines playback volume based on the noise data power information NPp supplied from the power analyzing unit 23 and the musical tune data power information MPp' supplied from the power analyzing unit 27 to generate volume adjustment information for adjusting the playback volume of the musical tune data.

For example, if the musical tune data maximum power value MPpmax' supplied as the power information MPp' exceeds the noise data maximum power value NPpmax supplied as the power information NPp, the determining unit 28 determines that sound leakage is caused. If the musical tune data maximum power value MPpmax' does not exceed the noise data maximum power value NPpmax, the determining unit 28 determines that sound leakage is not caused.

A volume selecting unit 29 adjusts the volume of the musical tune data based on the volume adjustment information supplied from the determining unit 28. For example, if the volume adjustment information indicates that the playback volume of the musical tune is to be adjusted, the volume selecting unit 29 adjusts the volume of the musical tune. If the volume adjustment information indicates that the playback volume of the musical tune is not to be adjusted, the volume selecting unit 29 does not adjust the volume of the musical tune.

Figure 7:
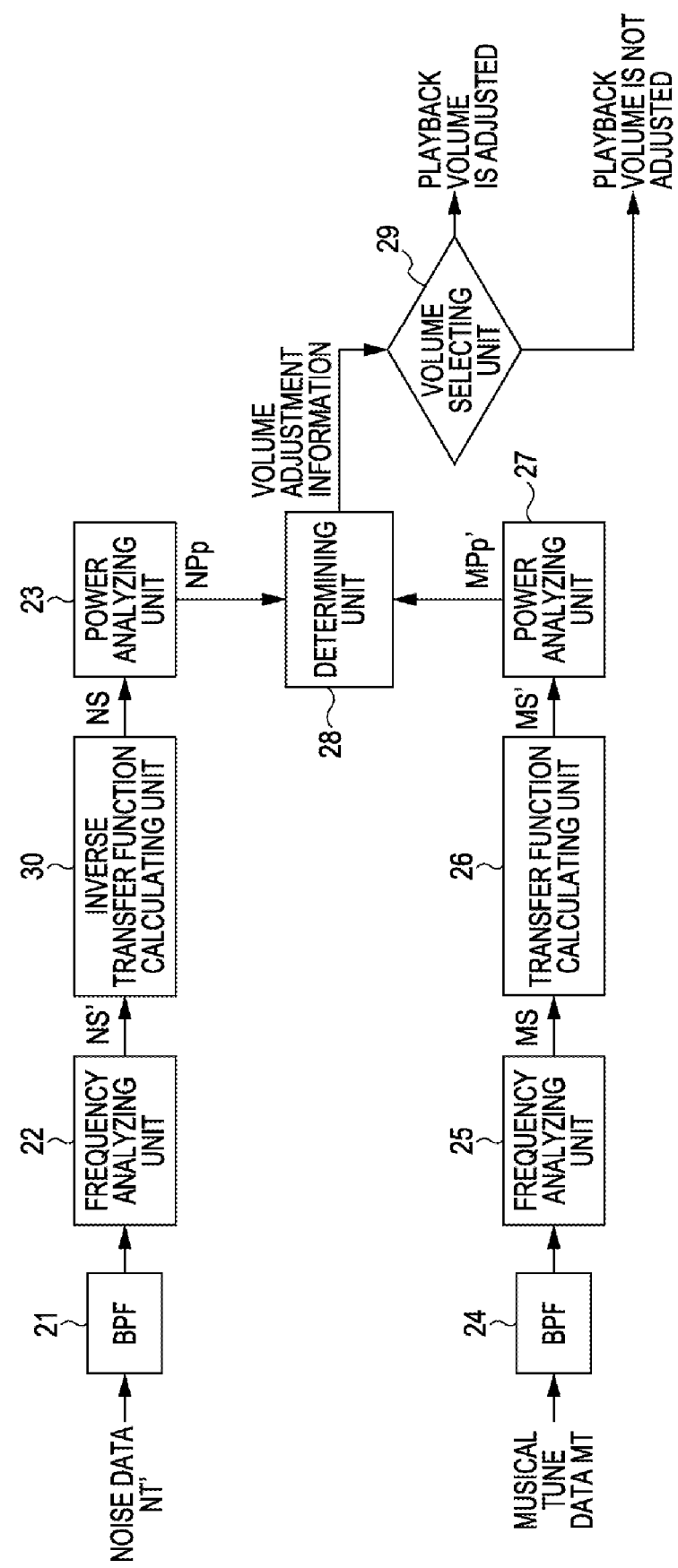
FIG. 7 is a block diagram for illustrating an example method for adjusting playback volume in accordance with ambient noise employed when a microphone is provided inside of a headphone.

Referring to FIG. 7, a method for adjusting playback volume employed when the microphone 3 is provided inside of the headphone 2 will now be described. Units common to a case where the microphone 3 is provided outside of the headphone 2 shown in FIG. 6 are attached with similar or like references and a detailed description is omitted.

Noise data NT' of ambient noise that passes through the headphone 2 and is collected by the microphone 3 is supplied to a bandpass filter 21. The bandpass filter 21 extracts a predetermined frequency component, such as an intermediate frequency component, from the noise data NT' and supplies the extracted frequency component to a frequency analyzing unit 22. The frequency analyzing unit 22 performs frequency analysis on the supplied noise data NT' to obtain frequency information NS'. The obtained frequency information NS' is supplied to an inverse transfer function calculating unit 30.

The inverse transfer function calculating unit 30 performs convolution of a predetermined inverse transfer function $H^{-1}$ on the frequency information NS' supplied from the frequency analyzing unit 22 and outputs frequency information NS, which corresponds to the noise data NT residing outside of the headphone 2.

A power analyzing unit 23 performs power analysis at the predetermined frequency band of the noise data NT based on the frequency information NS supplied from the inverse transfer function calculating unit 30 to calculate power information NPp. The calculated power information NPp is supplied to a determining unit 28.

On the other hand, musical tune data MT of a musical tune recorded in the playback apparatus 1 is supplied to a bandpass filter 24. The bandpass filter 24 extracts a predetermined frequency component, such as an intermediate frequency component, from the musical tune data MT and supplies the extracted frequency component to a frequency analyzing unit 25. The frequency analyzing unit 25 performs frequency analysis on the supplied musical tune data MT to obtain frequency information MS. The obtained frequency information MS is supplied to a transfer function calculating unit 26.

The transfer function calculating unit 26 performs convolution of a predetermined transfer function H on the frequency information MS supplied from the frequency analyzing unit 25 and outputs frequency information MS', which corresponds to the musical tune data MT' that leaks to the outside of the headphone 2.

A power analyzing unit 27 performs power analysis at the predetermined frequency band of the musical tune data MT based on the frequency information MS' supplied from the transfer function calculating unit 26 to calculate power information MPp'. The calculated power information MPp' is supplied to the determining unit 28.

The determining unit 28 determines playback volume based on the noise data power information NPp supplied from the power analyzing unit 23 and the musical tune data power information MPp' supplied from the power analyzing unit 27 to generate volume adjustment information. A volume selecting unit 29 adjusts the volume of the musical tune data based on the volume adjustment information supplied from the determining unit 28.

Figure 8:
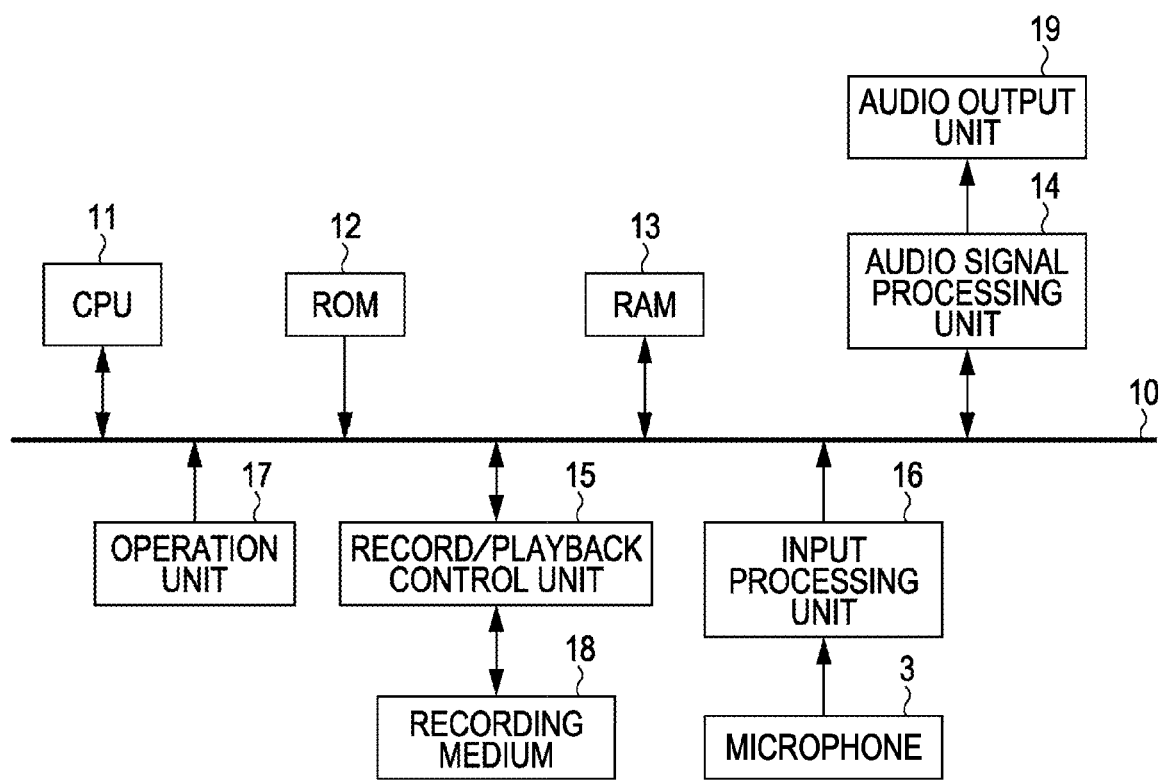
FIG. 8 is a block diagram showing an example of a configuration of a playback apparatus according to a first embodiment of the present invention.

An example of a configuration of the playback apparatus 1 according to the first embodiment of the present invention will be described with reference to FIG. 8. Parts closely related to the first embodiment of the present invention are illustrated in FIG. 8 and a description of the other parts is omitted. The playback apparatus 1 includes a central processing unit (CPU) 11, a read only memory (ROM) 12, a random access memory (RAM) 13, an audio signal processing unit 14, a record/playback control unit 15, an input processing unit 16, and an operation unit 17, which are connected to each other through a bus 10.

The CPU 11 uses the RAM 13 as a work memory and controls operations of the playback apparatus 1 in accordance with programs previously stored in the ROM 12. For example, the CPU 11 exchanges commands and data with each unit through the bus 10 to control the unit. The CPU 11 also controls playback of musical tune data recorded on a recording medium 18 in accordance with an operation performed on the operation unit 17, which will be described later.

The CPU 11 performs the playback volume adjusting processing described using FIGS. 6 and 7. The CPU 11 receives ambient noise data collected by the microphone 3 through the input processing unit 16 and analyzes the noise data. The CPU 11 also receives musical tune data of a digital audio signal from the audio signal processing unit 14, which will be described later, and analyzes the musical tune data. The CPU 11 then controls the playback volume of the musical tune in accordance with the analysis results of the noise data and the musical tune data.

The audio signal processing unit 14 is connected to an audio output unit 19. The audio signal processing unit 14 receives playback-target musical tune data from the recording medium 18, which will be described later, through the record/playback control unit 15 and performs various kinds of processing, such as digital-to-analog (D/A) conversion, on the musical tune data to convert the musical tune data into an analog audio signal. When the musical tune data is compressed, the audio signal processing unit 14 decompresses the musical tune data using a predetermined compression method. The audio signal processing unit 14 then supplies the musical tune data, which is a digital audio signal, to the CPU 11. The audio signal processing unit 14 also outputs the analog audio signal musical tune data through the audio output unit 19. For example, the headphone 2 or a speaker can be used as the audio output unit 19.

The record/playback control unit 15 is connected to the recording medium 18. The record/playback control unit 15 controls recording of data on the recording medium 18 and playback of data recorded on the recording medium 18. The recording medium 18 stores musical tune data. For example, a removable nonvolatile memory, a removable hard disk, or a hard disk included in the playback apparatus 1 can be used as the recording medium 18.

The input processing unit 16 is connected to the microphone 3. The microphone 3 collects ambient noise, converts the collected ambient noise data into an analog audio signal, and supplies the analog audio signal to the input processing unit 16. The input processing unit 16 performs various kinds of processing, such as analog-to-digital (A/D) conversion, on the analog audio signal supplied from the microphone 3 to convert the analog audio signal into digital noise data. The converted noise data is supplied to the CPU 11.

The operation unit 17 includes various operation keys for use in operation of the playback apparatus 1 and outputs a control signal corresponding to each operation key. For example, the operation unit 17 includes a play/stop key for starting/stopping playback of musical tune data, a volume adjusting key for adjusting playback volume, and a key for instructing automatic adjustment of playback volume.

Figure 9:
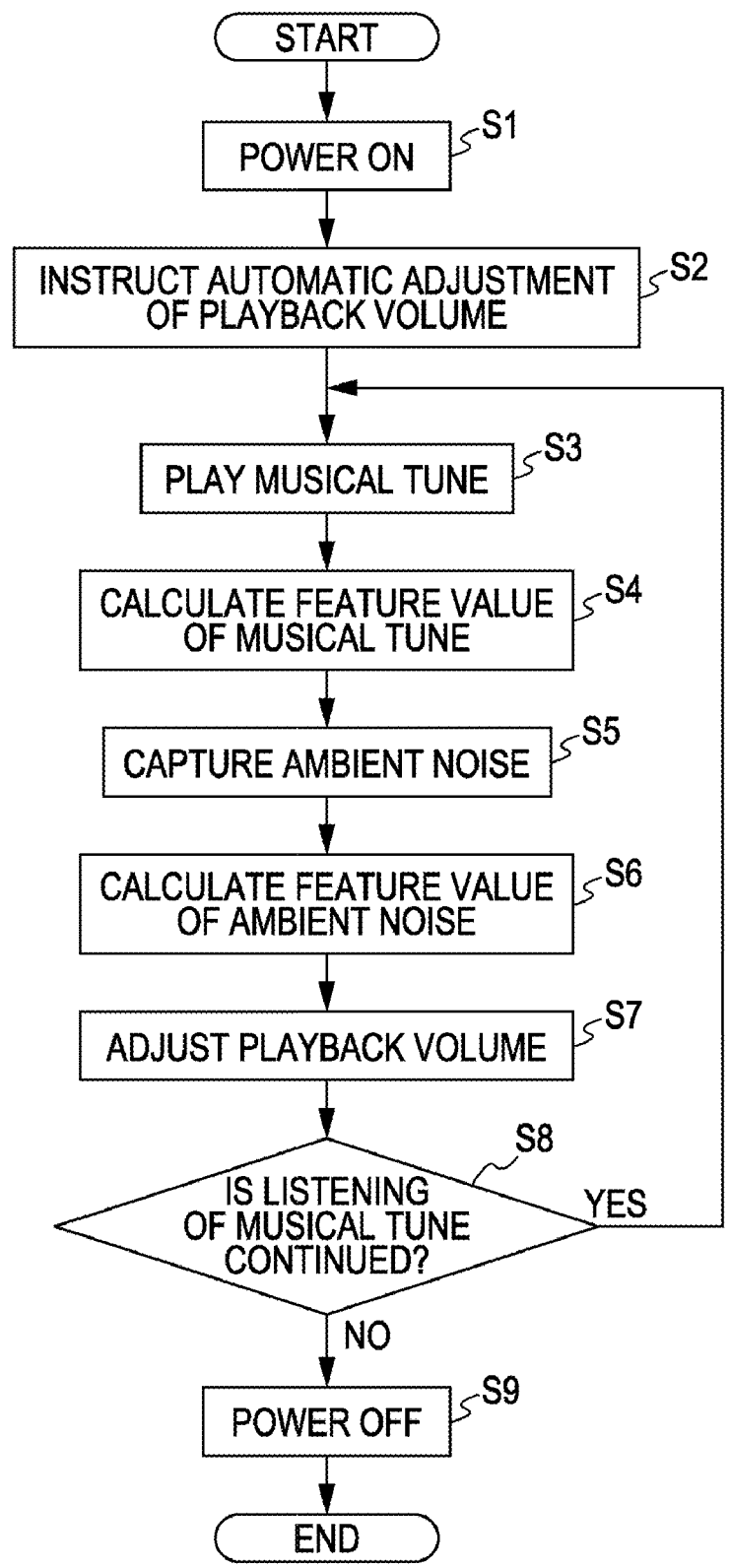
FIG. 9 is a flowchart for illustrating a flow of playback volume adjusting processing according to a first embodiment of the present invention.

A flow of playback volume adjusting processing according to the first embodiment of the present invention will be described with reference to a flowchart shown in FIG. 9. Processing described below is executed under control of the CPU 11 unless otherwise noted. In addition, it is assumed that the processing described below is cyclically repeated every predetermined time. A description is given for a case where the microphone 3 is provided outside of the headphone 2, for example.

At STEP S1, the playback apparatus 1 is turned ON. At STEP S2, a user operates a key for instructing automatic adjustment of playback volume provided in the operation unit 17. At STEP S3, the user selects a predetermined musical tune. Musical tune data of the selected musical tune is read out from the recording medium 18 and is reproduced.

At STEP S4, frequency analysis is performed on a component of the reproduced musical tune data that leaks to the outside of the headphone 2 to calculate the power information MPp' serving as a feature value of the musical tune residing outside of the headphone 2. At STEP S5, ambient noise is collected with the microphone 3. At STEP S6, frequency analysis is performed on the noise data NT of the collected ambient noise to calculate the power information NPp serving as a feature value of the ambient noise.

At STEP S7, the volume adjustment information is generated based on the calculated musical tune power information MPp' and ambient noise power information NPp. The playback volume of the musical tune is then adjusted based on the volume adjustment information.

At STEP S8, whether the user continues to listen to the music is determined. If it is determined that the user continues to listen to the music, the process returns to STEP S3 and playback of the musical tune is continued.

If it is determined that the user does not continue to listen to the music, the process proceeds to STEP S9. At STEP S9, the user turns OFF the playback apparatus 1. The process then terminates.

As described above, in the first embodiment of the present invention, ambient noise is collected every predetermined time and a feature value of the ambient noise is extracted. A feature value of a musical tune is also extracted. Playback volume of the musical tune is adjusted based on the extracted feature values. Accordingly, it is possible to adjust the playback volume of the musical tune to an appropriate level in accordance with a change in the ambient noise and to prevent sound from leaking to the outside.

A first modification of the first embodiment of the present invention will now be described. In the playback volume adjusting method employable in the above-described first embodiment, playback volume of a musical tune is adjusted using noise data having, for example, short time duration of 0.5 seconds or so at the time of calculation of power information NPp serving as a feature value of ambient noise. Accordingly, an amount of adjustment of the playback volume is controlled by the short time during which the noise data is obtained.

For example, in a case where a user is in a train, a feature value of ambient noise significantly changes depending on whether people around the user is having a conversation or not. In such a case, if the volume is finely adjusted in accordance with a change in the ambient noise, the user may feel uncomfortable.

Accordingly, in the first modification of the first embodiment of the present invention, whether to adjust the volume is determined based on feature values of a musical tune and ambient noise collected every predetermined time and a predetermined number of determination results are stored in a memory. Playback volume is adjusted using weighting factors for reducing the weight of the data as the data gets older based on the predetermined number of determination results.

Figure 10:
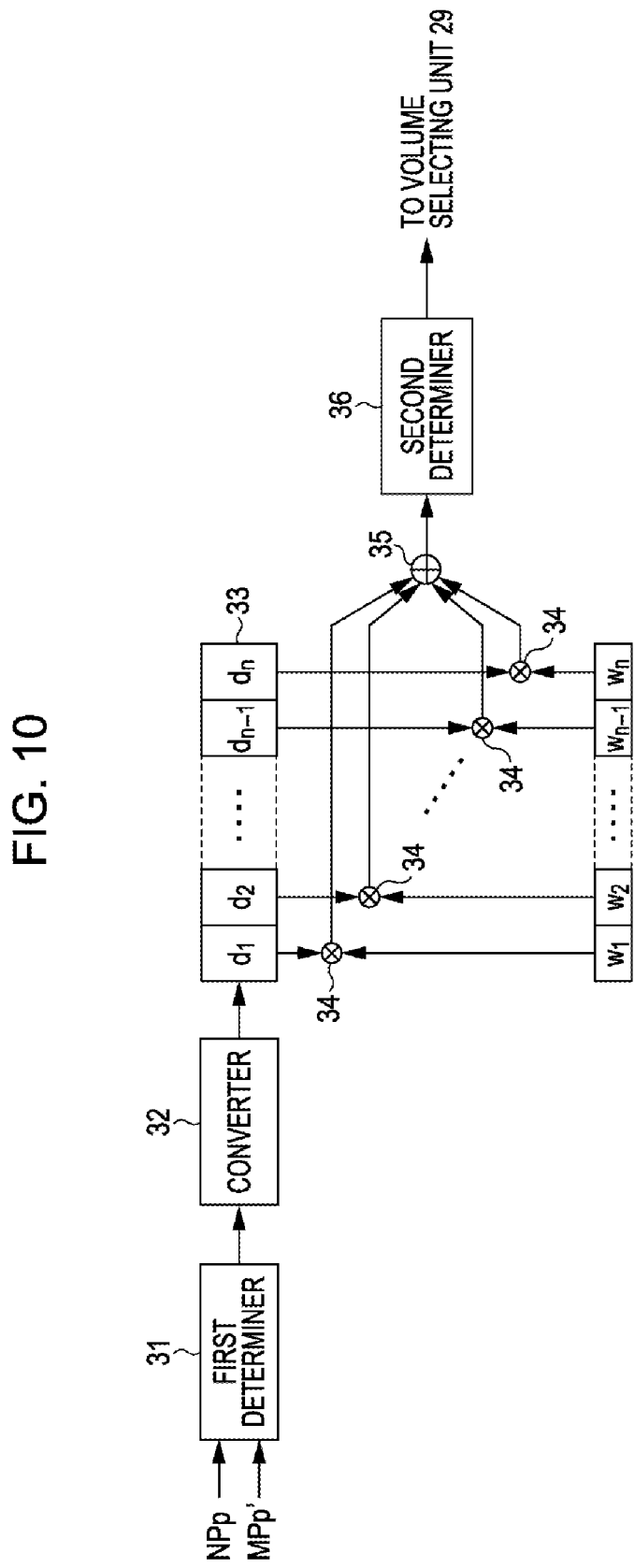
FIG. 10 is a block diagram for illustrating an example method for adjusting playback volume according to a first modification of a first embodiment of the present invention.

FIG. 10 is a block diagram for illustrating an example method for adjusting playback volume according to the first modification of the first embodiment of the present invention. Processing shown in FIG. 10 corresponds to processing of the determining unit 28 described above in the first embodiment with reference to FIG. 6.

A first determiner 31 is supplied with power information NPp resulting from frequency analysis performed on noise data NT of ambient noise and power information MPp' resulting from frequency analysis performed on a component of musical tune data MT of a musical tune that leaks to the outside. The first determiner 31 determines playback volume based on the supplied ambient noise power information NPp and musical tune power information MPp' to generate volume determination information, which indicates a determination result of the playback volume of the musical tune data. The generated volume determination information is supplied to a converter 32.

The converter 32 converts the determination result into a predetermined numeric value based on the supplied volume determination information. For example, when the playback volume is turned down, the converter 32 converts the determination result into "−1". When the playback volume is not changed, the converter 32 converts the determination result into "0". When the playback volume is turned up, the converter 32 converts the determination result into "1". The numeric data based on the determination result is supplied to a memory 33.

The memory 33 has areas capable of storing a predetermined times of determination results, e.g., n pieces of data. Upon receiving new data, the memory 33 shifts stored data by one position to discard the oldest data and store the supplied new data.

More specifically, for example, when the memory 33 is supplied with new data, oldest data $d_n$ of pieces of data stored in the memory 33 is discarded. Data $d_{n-1}$ is shifted by one position and is stored as the data $d_n$. Similarly, pieces of data $d_3, d_2$, and $d_1$ are shifted by one position and are stored in the memory 33 as the data $d_4, d_3$, and $d_2$, respectively. The newly supplied data is then stored in the memory 33 as the data $d_1$.

The pieces of data $d_1, d_2, \ldots, d_n$ stored in the memory 33 are supplied to multipliers 34, 34, . . . , respectively.

The multipliers 34, 34, . . . perform convolution of weighting factors $w_1, w_2, \ldots, w_n$ on the pieces of data $d_1, d_2, \ldots, d_n$ supplied from the memory 33, respectively. The weighting factors $w_1, w_2, \ldots, w_n$ are coefficients for determining a weight of data stored in the memory 33. As represented by Equation (1), the weighting factors are set so that the weight decreases as the data gets older.

$$1 \geq w_1 \geq w_2 \geq \ldots \geq w_{n-1} \geq w_n \geq 0 \qquad (1)$$

Pieces of data resulting from the convolution of the weighting factors $w_1, w_2, \ldots, w_n$ on the pieces of data $d_1, d_2, \ldots, d_n$, respectively, are supplied to an adder 35. The adder 35 adds the pieces of data resulting from the convolution supplied from the multipliers 34, 34, . . . and supplies the result to a second determiner 36.

The second determiner 36 calculates an average of the data supplied from the adder 35 to determine the ambient noise in accordance with the calculation result. Since values "−1", "0", and "1" are determined when the playback volume is turned down, is not changed, and is turned up, respectively, in this example, the second determiner 36 determines to turn up the playback volume if the average of the data exceeds "0" using "0" as a criterion. If the average of the data is smaller than "0", the second determiner 36 determines to turn down the playback volume. If the average of the data is equal to "0", the second determiner 36 determines not to adjust the playback volume. The second determiner 36 then generate volume adjustment information for adjusting the playback volume of the musical tune data and supplies the volume adjustment information to a volume selecting unit 29.

As described above, in the first modification of the first embodiment of the present invention, whether to adjust the volume is determined based on feature values of a musical tune and ambient noise collected every predetermined time and playback volume is adjusted. In addition, calculation is performed so that weight of older ambient noise data decreases. Accordingly, volume adjustment determination results can be stabilized compared to the volume adjusting method according to the above-described first embodiment by averaging the determination results.

A second modification of the first embodiment of the present invention will now be described. In the second modification of the first embodiment of the present invention, volume adjusting processing is applied to a playback apparatus having a noise canceling function. As described in the section "Description of the Related Art", the noise canceling function is for reducing ambient noise heard by a user by adding an ambient noise canceling component to reproduced sound based on collected ambient noise.

However, volume of actually collected ambient noise in this case is not reduced. Accordingly, when playback volume of a musical tune is adjusted based on a feature value of the actually collected ambient noise, the playback volume of the musical tune becomes large relative to the reduced volume of the ambient noise heard by the user.

Accordingly, in the second modification of the first embodiment, an equivalent filter having an effect equivalent to an ambient noise reduction effect offered by the noise canceling function is provided on an input side of the collected ambient noise. Playback volume of a musical tune is adjusted based on a feature value of the ambient noise reduced by the equivalent filter.

Figure 11:
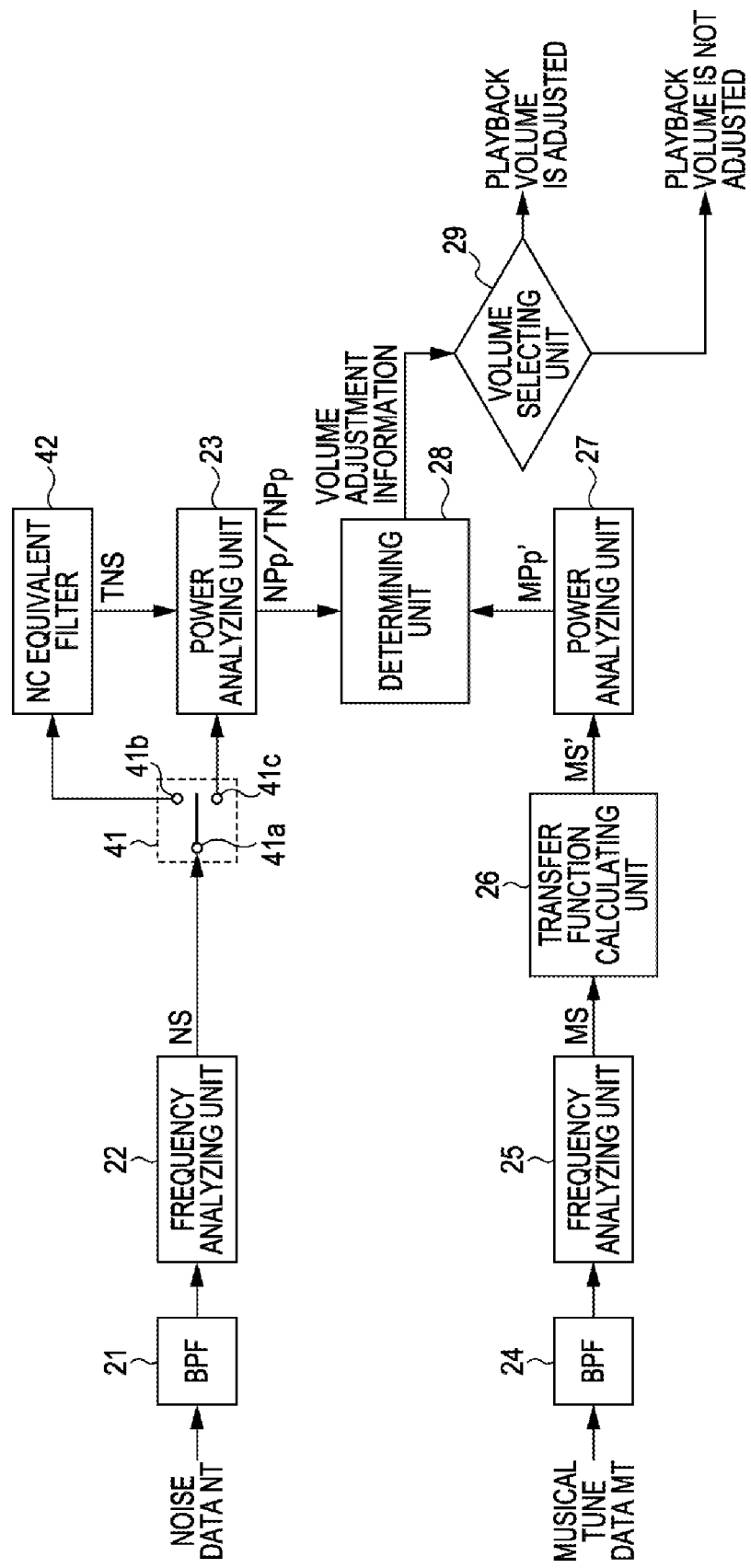
FIG. 11 is a block diagram for illustrating an example method for adjusting playback volume according to a second modification of a first embodiment of the present invention.

FIG. 11 is a block diagram for illustrating an example method for adjusting playback volume according to the second modification of the first embodiment of the present invention. Here, a description will be given for a case where the microphone 3 is provided outside of the headphone 2, for example. Units common to the first embodiment shown in FIG. 6 are attached with similar or like references and a detailed description is omitted.

Noise data NT that is collected by the microphone 3 and whose predetermined frequency component is extracted by a bandpass filter 21 is supplied to a frequency analyzing unit 22. The frequency analyzing unit 22 performs predetermined frequency analysis. Frequency information NS resulting from the frequency analysis is supplied to a switch 41.

The switch 41 has an input terminal 41$a$ and output terminals 41$b$ and 41$c$. The switch 41 selectively outputs the frequency information NS supplied to the input terminal 41$a$ from one of the output terminals 41$b$ and 41$c$ in accordance with ON/OFF of a noise canceling function based on an operation performed by a user on the operation unit 17.

When the noise canceling function is turned ON, the output terminal 41$b$ is selected. The frequency information NS supplied to the input terminal 41$a$ is output from the output terminal 41$b$ and is supplied to an equivalent filter 42. On the other hand, when the noise canceling function is turned OFF, the output terminal 41$c$ is selected. The frequency information NS is output from the output terminal 41$c$ and is supplied to a power analyzing unit 23.

The equivalent filter 42 performs processing, which provides an effect equivalent to a noise reduction effect obtained when the noise canceling function is used, on the frequency information NS of the noise data NT of the collected ambient noise to generate frequency information TNS of reduced noise data. The generated frequency information TNS is supplied to the power analyzing unit 23.

The power analyzing unit 23 performs power analysis at a predetermined frequency band of the frequency information NS of the noise data NT supplied from the switch 41 or the frequency information TNS of the reduced noise data supplied from the equivalent filter 42 to calculate power information NPp or TNPp. The calculated power information NPp or TNPp is supplied to a determining unit 28.

On the other hand, musical tune data MT of a musical tune recorded in the playback apparatus 1 is supplied to a bandpass filter 24. The bandpass filter 24 extracts a predetermined frequency component and supplies the extracted frequency component to a frequency analyzing unit 25. The frequency analyzing unit 25 performs predetermined frequency analysis on the predetermined frequency component of the musical tune data MT and supplies frequency information MS resulting from the frequency analysis to a transfer function calculating unit 26.

The transfer function calculating unit 26 performs convolution of a predetermined transfer function H on the supplied frequency information MS and outputs frequency information MS, which corresponds to the musical tune data MT' that leaks to the outside of the headphone 2.

A power analyzing unit 27 performs power analysis at the predetermined frequency band of the musical tune data MT based on the frequency information MS' supplied from the transfer function calculating unit 26 to calculate power information MPp'. The calculated power information MPp' is supplied to the determining unit 28.

The determining unit 28 determines playback volume based on the noise data power information NPp or TNPp and the musical tune data power information MPp' to generate volume adjustment information. A volume selecting unit 29 adjusts the volume of the musical tune data based on the volume adjustment information supplied from the determining unit 28.

As described above, since playback volume of a musical tune is adjusted in accordance with reduced ambient noise heard by a user using an equivalent filter having an effect equivalent to a noise reduction effect of a noise canceling function, the musical tune can be played back at the volume comfortable for the user's ears.

In addition, the volume of the ambient noise heard by the user is lower than that of actual ambient noise due to the noise canceling function. Accordingly, since the playback volume of the musical tune set based on the feature value of the reduced ambient noise is a level that may be masked by actual ambient noise but is not masked by the reduced ambient noise heard by the user, the user can appropriately listen to the musical tune.

Although a case where the microphone 3 is provided outside of the headphone 2 has been described in this example, the method according to the second modification is not limitedly applied to this particular example. For example, the method can be similarly applied to a case where the microphone 3 is provided inside of the headphone 2.

A second embodiment of the present invention will now be described. In the above-described first embodiment, external ambient noise is collected with the microphone 3. However, the ambient noise collected during playback of a musical tune includes a musical tune signal component that passes through the headphone 2 and leaks to the outside. Accordingly, a feature value of the ambient noise is not accurately extracted.

Accordingly, in the second embodiment of the present invention, a feature value of ambient noise collected when sound leakage from the headphone 2 is less, such as a case where volume of a musical tune is low, or while no sound is leaking from the headphone 2 is extracted and playback volume of the musical tune is adjusted.

Figure 12:
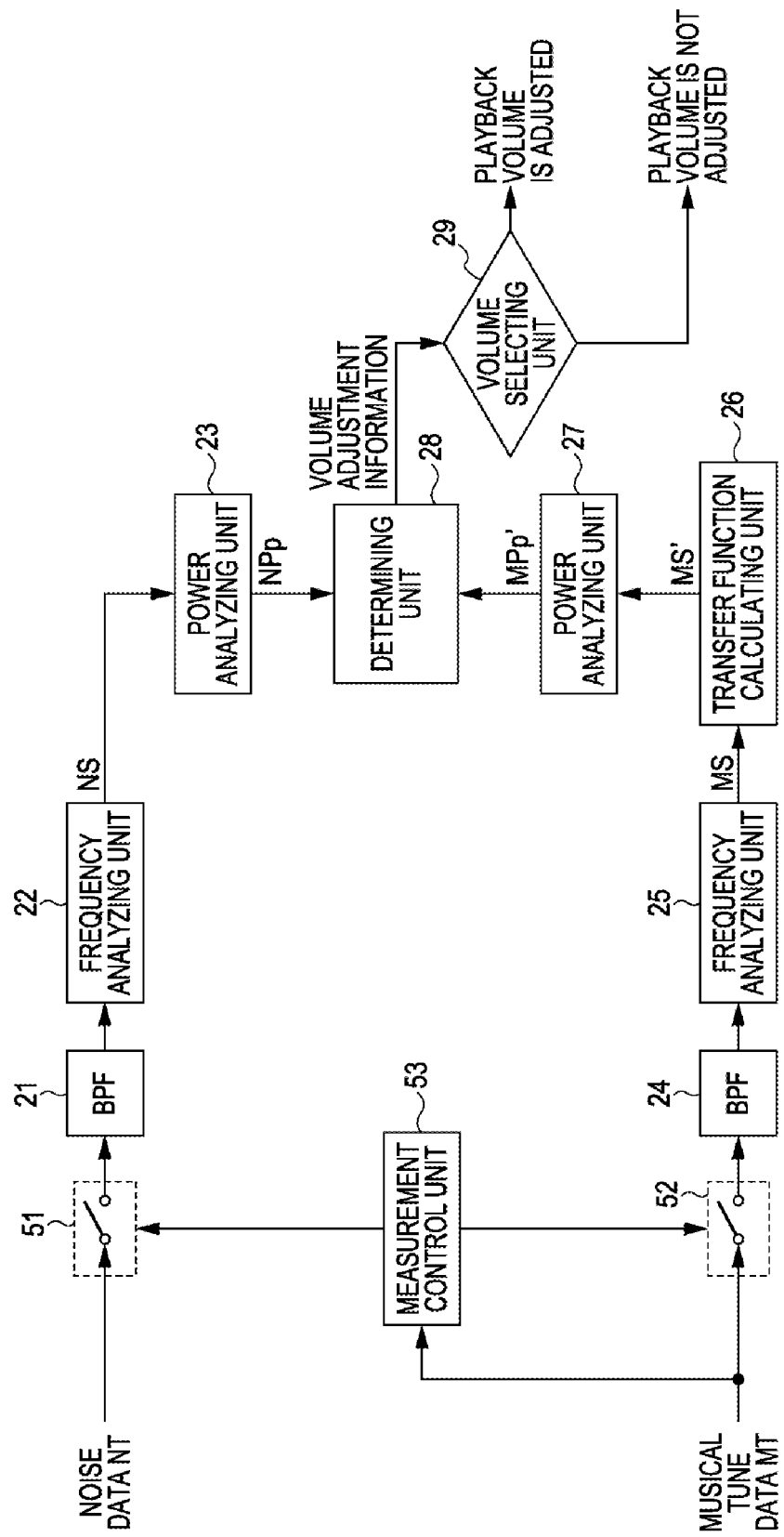
FIG. 12 is a block diagram for illustrating an example method for adjusting playback volume according to a second embodiment of the present invention.

FIG. 12 is a block diagram for illustrating an example method for adjusting playback volume according to the second embodiment of the present invention. In this example, a description will be given for a case where the microphone 3 is provided outside of the headphone 2. Units common to the first embodiment shown in FIG. 6 are attached with similar or like references and a detailed description is omitted.

A measurement control unit 53 is supplied with musical tune data MT of a musical tune recorded in the playback apparatus 1 and measures the volume of the musical tune data MT. The measurement control unit 53 controls ON/OFF of a switch 51 based on the measurement result. A threshold for the volume of the musical tune data MT is previously set in the measurement control unit 53. If the volume of the musical tune data MT does not exceed the threshold, the measurement control unit 53 turns ON the switch 51. If the volume of the musical tune data MT exceeds the threshold, the measurement control unit 53 turns OFF the switch 51. A switch 52 is turned ON except for when the measurement control unit 53 performs a control operation using a timer, which will be described later.

Noise data NT of ambient noise collected by the microphone 3 is supplied to the switch 51. If the switch 51 is turned ON under control of the measurement control unit 53, the noise data NT is supplied to a bandpass filter 21. The bandpass filter 21 extracts a predetermined frequency component of the noise data NT output from the switch 51. A frequency analyzing unit 22 performs predetermined frequency analysis. Frequency information NS resulting from the frequency analysis is supplied to a power analyzing unit 23. The power analyzing unit 23 performs power analysis at a predetermined frequency band of the frequency information NS of the noise data NT supplied from the switch 51 to calculate power information NPp. The calculated power information NPp is supplied to a determining unit 28.

On the other hand, musical tune data MT of a musical tune recorded in the playback apparatus 1 is supplied to a bandpass filter 24 through the switch 52. The bandpass filter 24 extracts a predetermined frequency component and supplies the extracted frequency component to a frequency analyzing unit 25. The frequency analyzing unit 25 performs predetermined frequency analysis on the predetermined frequency component of the musical tune data MT and supplies frequency information MS resulting from the frequency analysis to a transfer function calculating unit 26.

The transfer function calculating unit 26 performs convolution of a predetermined transfer function H on the supplied frequency information MS and outputs frequency information MS', which corresponds to the musical tune data MT' that leaks to the outside of the headphone 2.

A power analyzing unit 27 performs power analysis at a predetermined frequency band of the musical tune data MT based on the frequency information MS' supplied from the transfer function calculating unit 26 to calculate power information MPp'. The calculated power information MPp' is supplied to the determining unit 28.

The determining unit 28 determines playback volume based on the noise data power information NPp and the musical tune data power information MPp' to generate volume adjustment information. A volume selecting unit 29 adjusts the volume of the musical tune data based on the volume adjustment information supplied from the determining unit 28.

The volume of the musical tune does not become equal to or lower than the threshold when the measurement control unit 53 measures the volume of the musical tune data MT depending on the musical tune. In such a case, the measurement control unit 53 uses a timer, for example. If the volume of the musical tune data MT does not become equal to or lower than the threshold during a predetermined period set in the timer, the measurement control unit 53 turns ON the switch 51 to collect the ambient noise. At this time, the measurement control unit 53 may turn OFF the switch 52. For example, when the volume of the musical tune data MT does not become equal to or lower than the threshold for the predetermined period, information indicating that the ambient noise is not collected is presented to a user. If the user instructs collection of the ambient noise, the measurement control unit 53 may turn OFF the switch 52 to avoid an effect of a sound leak component of the reproduced musical tune.

Figure 13:
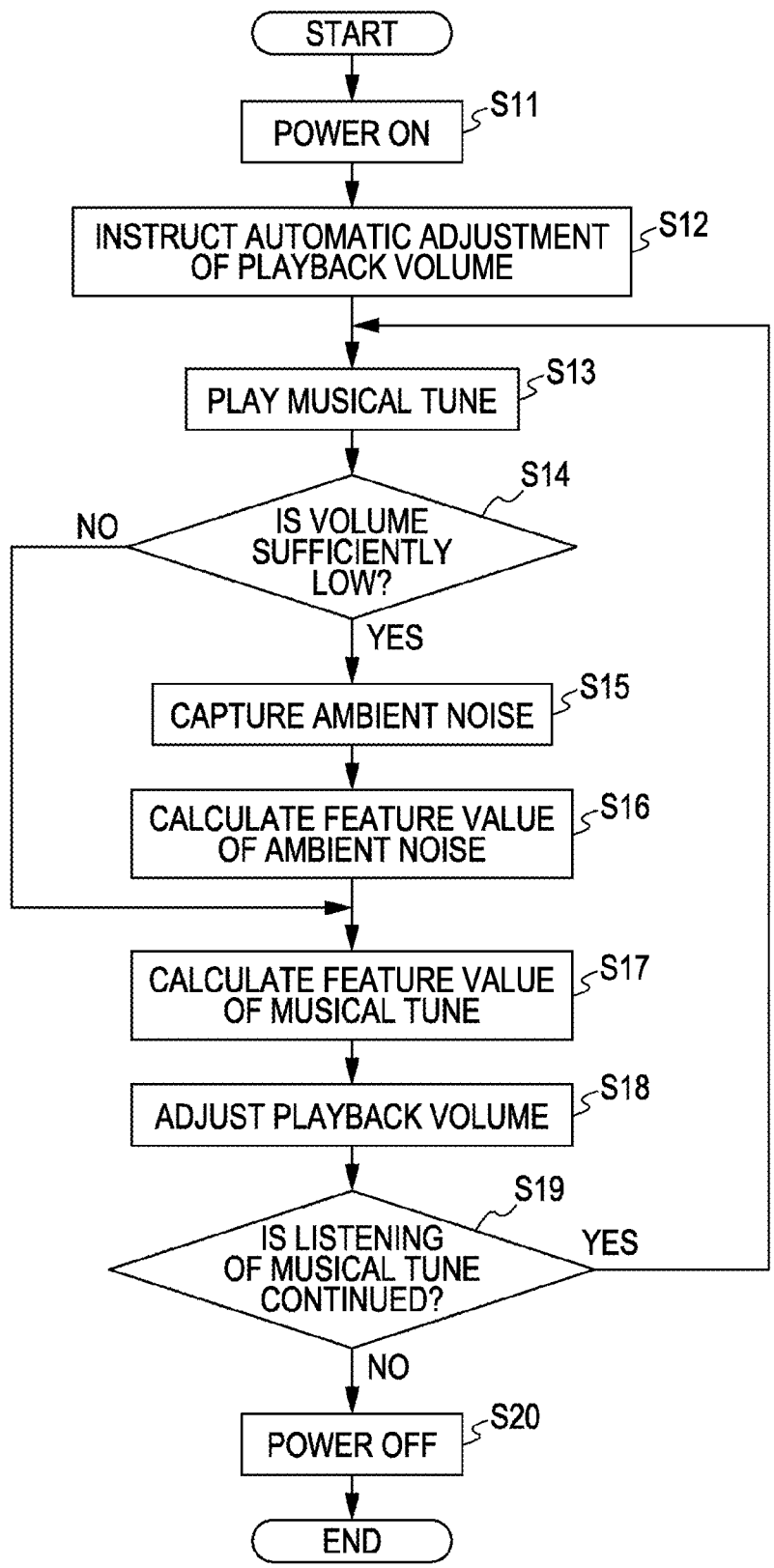
FIG. 13 is a flowchart for illustrating a flow of playback volume adjusting processing according to a second embodiment of the present invention.

A flow of playback volume adjusting processing according to the second embodiment of the present invention will be described with reference to a flowchart shown in FIG. 13. Processing described below is executed under control of the CPU 11 unless otherwise noted. In addition, it is assumed that the processing described below is cyclically repeated every predetermined time.

At STEP S11, the playback apparatus 1 is turned ON. At STEP S12, a user operates a key for instructing automatic adjustment of playback volume provided in the operation unit 17. At STEP S13, the user selects a predetermined musical tune. Musical tune data of the selected musical tune is read out from the recording medium 18 and is reproduced.

At STEP S14, the volume of the reproduced musical tune data MT is compared with the threshold for the volume of the musical tune data MT previously set in the measurement control unit 53 to determine whether the volume of the musical tune data MT is sufficiently low. If the volume of the musical tune data MT does not exceed the threshold, it is determined that the volume of the musical tune data MT is sufficiently low. The process then proceeds to STEP S15.

At STEP S15, ambient noise is collected with the microphone 3. At STEP S16, frequency analysis is performed on the noise data NT of the collected ambient noise to calculate power information NPp serving as a feature value of the ambient noise.

On the other hand, if the volume of the musical tune data MT exceeds the threshold at STEP S14, it is determined that the volume of the musical tune data MT is high. The process then proceeds to STEP S17. At STEP S17, frequency analysis is performed on a component of the reproduced musical tune data that leaks to the outside of the headphone 2 to calculate power information MPp' serving as a feature value of the musical tune residing outside of the headphone 2.

At STEP S18, the volume adjustment information is generated based on the calculated musical tune power information MPp' and ambient noise power information NPp. The playback volume of the musical tune is adjusted based on the volume adjustment information.

At STEP S19, whether the user continues to listen to the music is determined. If it is determined that the user continues to listen to the music, the process returns to STEP S13 and playback of the musical tune is continued. If it is determined that the user does not continues to listen to the music, the process proceeds to STEP S20. At STEP S20, the user turns OFF the playback apparatus 1. The process then terminates.

As described above, in the second embodiment of the present invention, ambient noise is collected when the volume of the musical tune data MT is sufficiently low and the playback volume of the musical tune is adjusted based on the collected ambient noise. Accordingly, it is possible to collect the ambient noise without receiving an effect of a sound leak component of the reproduced musical tune and to accurately extract a feature value of the ambient noise.

Although the description has been given for the case where the microphone 3 is provided outside of the headphone 2 in this example, the method according to the second embodiment is not limitedly applied to this particular example. For example, the method according to the second embodiment can be similarly applied to a case where the microphone 3 is provided inside of the headphone 2.

A third embodiment of the present invention will be described. In the third embodiment of the present invention, a sound leak component of a musical tune is eliminated from collected ambient noise. The sound-leak-component eliminated ambient noise is analyzed to extract a feature value of the ambient noise and adjust playback volume of the musical tune.

Figure 14:
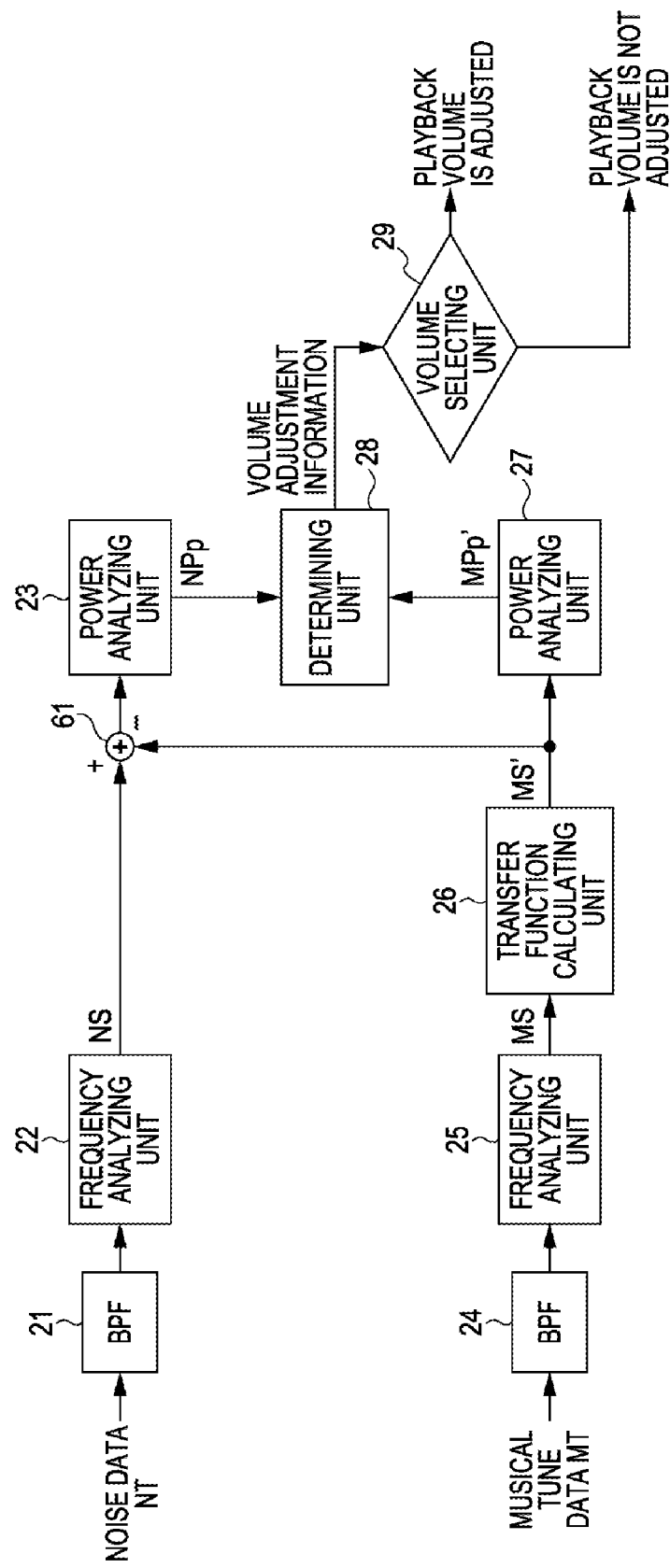
FIG. 14 is a block diagram for illustrating an example method for adjusting playback volume according to a third embodiment of the present invention.

FIG. 14 is a block diagram for illustrating an example method for adjusting playback volume according to the third embodiment of the present invention. A description will be given for a case where the microphone 3 is provided outside of the headphone 2 in this example. Units common to the first embodiment shown in FIG. 6 are attached with similar or like references and a detailed description is omitted.

A bandpass filter 21 extracts a predetermined frequency component of noise data NT of ambient noise collected by the microphone 3. A frequency analyzing unit 22 performs predetermined frequency analysis. Frequency information NS resulting from the frequency analysis is supplied to one input terminal of an adder 61.

On the other hand, musical tune data MT of a musical tune recorded in the playback apparatus 1 is supplied to a bandpass filter 24. The bandpass filter 24 extracts a predetermined frequency component and supplies the extracted frequency component to a frequency analyzing unit 25. The frequency analyzing unit 25 performs predetermined frequency analysis on the predetermined frequency component of the musical tune data MT and supplies frequency information MS resulting from the frequency analysis to a transfer function calculating unit 26.

The transfer function calculating unit 26 performs convolution of a predetermined transfer function H on the supplied frequency information MS and outputs frequency information MS', which corresponds to the musical tune data MT that leaks outside of the headphone 2. The frequency information MS' output from the transfer function calculating unit 26 is supplied to the other input terminal of the adder 61.

The adder 61 subtracts the frequency information MS' of the musical tune data MT input to the other input terminal from the frequency information NS of the noise data NT input to the one input terminal and supplies the result to a power analyzing unit 23.

The power analyzing unit 23 performs power analysis at the predetermined frequency band of the frequency information NS of the noise data NT supplied from the adder 61 to calculate power information NPp. The calculated power information NPp is supplied to a determining unit 28.

The frequency information MS' output from the transfer function calculating unit 26 is also supplied to a power analyzing unit 27. The power analyzing unit 27 performs power analysis at the predetermined frequency band of the musical tune data MT based on the frequency information MS' supplied from the transfer function calculating unit 26 to calculate power information MPp'. The calculated power information MPp' is supplied to the determining unit 28.

The determining unit 28 determines playback volume based on the noise data power information NPp and the musical tune data power information MPp' to generate volume adjustment information for adjusting playback volume of the musical tune data. A volume selecting unit 29 adjusts the volume of the musical tune data based on the volume adjustment information supplied from the determining unit 28.

Figure 15:
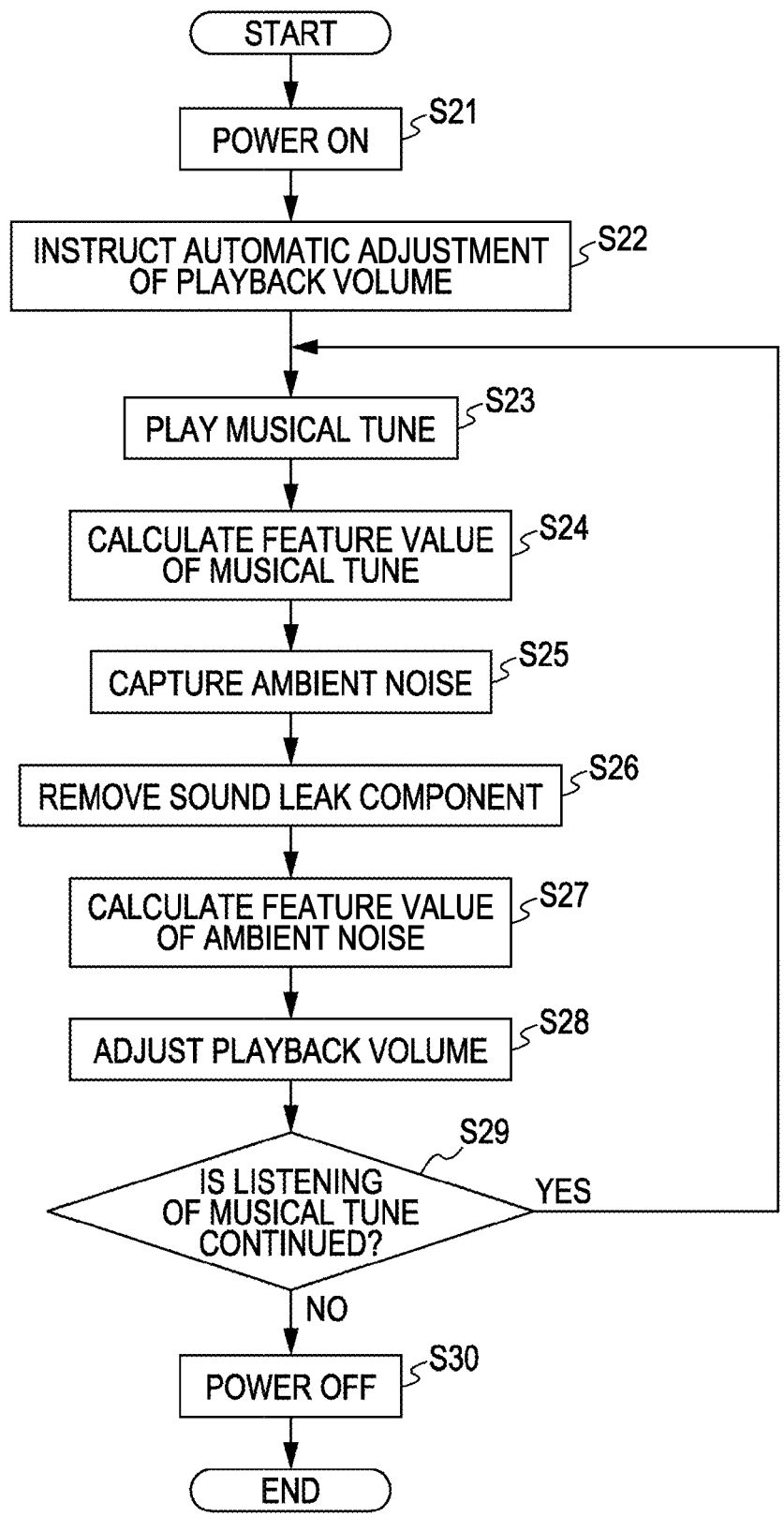
FIG. 15 is a flowchart for illustrating a flow of playback volume adjusting processing according to a third embodiment of the present invention.
Figure 16:
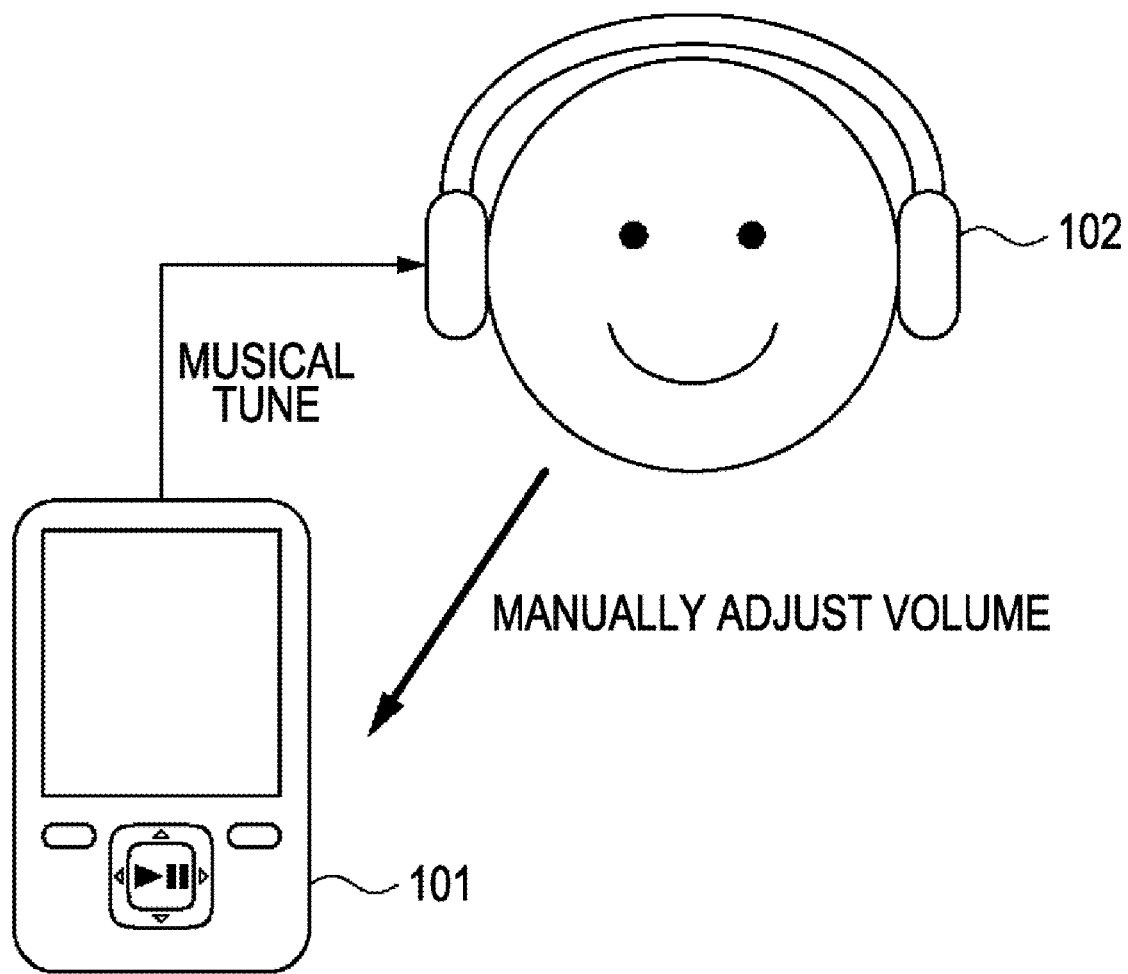
FIG. 16 is a schematic diagram showing a usage example of a playback apparatus according to the related art.
Figure 17:
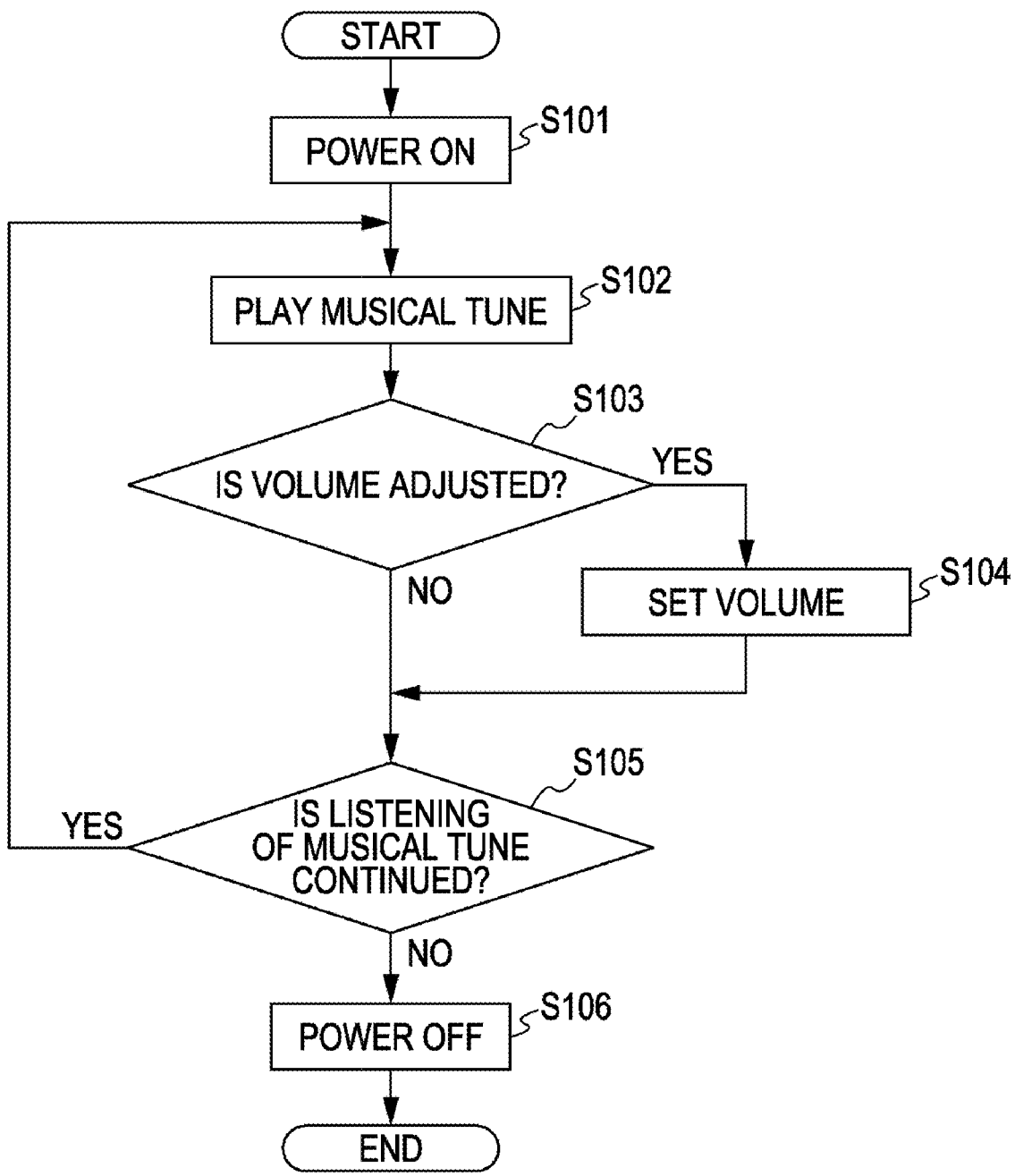
FIG. 17 is a flowchart for illustrating a playback method of a playback apparatus according to the related art.

A flow of playback volume adjusting processing according to the third embodiment of the present invention will be described with reference to a flowchart shown in FIG. 15. Processing described below is executed under control of the CPU 11 unless otherwise noted. It is also assumed that the processing described below is cyclically repeated every predetermined time.

At STEP S21, the playback apparatus 1 is turned ON. At STEP S2, a user operates a key for instructing automatic adjustment of playback volume provided in the operation unit 17. At STEP S23, the user selects a predetermined musical tune. Musical tune data of the selected musical tune is read out from the recording medium 18 and is reproduced.

At STEP S24, frequency analysis is performed on a component of the reproduced musical tune data that leaks to the outside of the headphone 2 to calculate power information MPp' serving as a feature value of the musical tune residing outside of the headphone 2. At STEP S25, ambient noise is collected with the microphone 3.

At STEP S26, frequency analysis is performed on noise data NT of the collected ambient noise. The frequency information MS' of the sound leak component of the musical tune is subtracted from the frequency information NS of the collected ambient noise to eliminate the sound leak component of the musical tune from the ambient noise. At STEP S27, power information NPp serving as a feature value is calculated based on the musical-tune sound-leak-component eliminated ambient noise.

At STEP S28, volume adjustment information is generated based on the calculated musical tune power information MPp' and ambient noise power information NPp. The playback volume of the musical tune is adjusted based on the volume adjustment information.

At STEP S29, whether the use continues to listen to the music is determined. If it is determined that the user continues to listen to the music, the process returns to STEP S23 and playback of the musical tune is continued.

If it is determined that the user does not continue to listen to the music, the process proceeds to STEP S30. At STEP S30, the user turns OFF the playback apparatus 1. The process then terminates.

As described above, in the third embodiment of the present invention, the frequency information MS' of the sound leak component of the musical tune is subtracted from the frequency information NS of the collected ambient noise. Accordingly, it is possible to collect ambient noise without receiving an effect of a sound leak component of a reproduced musical tune and to accurately extract a feature value of the ambient noise.

Although the description has been given for the case where the microphone 3 is provided outside of the headphone 2 in this example, the method according to the third embodiment is not limitedly applied to this particular example. For example, the method according to the third embodiment can be similarly applied to a case where the microphone 3 is provided inside of the headphone 2.

Although the first embodiment of the present invention, the first and second modifications of the first embodiment, the second and third embodiments of the present invention have been described above, the present invention is not limited to the first embodiment of the present invention, the first and second modifications of the first embodiment, the second and third embodiments described above and can be variously modified and applied within a scope not departing from the spirit of the present invention. For example, the volume adjusting methods according to the embodiments of the present invention are not limitedly applied to a playback apparatus but can be applied to a headphone capable of adjusting playback volume.

In addition, although a feature value is extracted using frequency analysis on ambient noise and a musical tune in the examples given above, the feature value extracting method is not limited to this particular example. For example, a time waveform analysis may be performed to analyze a transient characteristic and extract the feature value. As an example of calculating a feature value regarding the transient (transient response), time-axis data is divided for every predetermined samples, e.g., for every N samples called frames, and power is calculated in units of frames. A ratio of power of a frame to power of the previous frame or a difference between power values of these frames may be determined. Those values may be used as the feature value regarding the transient. As a power calculating method, for example, a method for adding sums of squares of the samples may be used. However, the power calculating method is not limited to this particular method and an appropriate method may be used.

In addition, the feature value may be extracted by performing both of the frequency analysis and the time waveform analysis.

The present application contains subject matter related to that disclosed in Japanese Priority Patent Application JP 2008-177934 filed in the Japan Patent Office on Jul. 8, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A volume adjusting apparatus comprising:
a sound collecting unit configured to collect noise data of a surrounding environment;
an analyzing unit configured to extract a feature value indicating a feature of the noise data collected by the sound collecting unit and a feature value indicating a feature of supplied musical tune data; and
a control unit configured to generate volume adjustment information for adjusting playback volume of the musical tune data based on the feature value of the noise data and the feature value of the musical tune data and adjust the playback volume of the musical tune data based on the volume adjustment information,
wherein the control unit includes a memory configured to store a predetermined number of pieces of the volume adjustment information, and the control unit generates the volume adjustment information based on the feature values of the noise data and the musical tune data every predetermined time and adjusts the playback volume of the musical tune data based on an average of the predetermined number of pieces of volume adjustment information stored in the memory
wherein the control unit performs convolution of weighting factors on the predetermined number of pieces of volume adjustment information stored in the memory, respectively, and adjusts the playback volume of the musical tune data based on the average of the predetermined number of pieces of weighting-factor convoluted volume adjustment information, and wherein the weighting factors are set so that a weight of the volume adjustment information reduces as the volume adjustment information gets older.

2. The apparatus according to claim 1, further comprising:
a first filter configured to extract a predetermined frequency band component from the noise data collected by the sound collecting unit; and
a second filter configured to extract the predetermined frequency band component from the supplied musical tune data,
wherein the analyzing unit extracts the feature values from the predetermined frequency band components of the noise data and the musical tune data.

3. The apparatus according to claim 1, wherein the analyzing unit performs a same frequency analysis on the noise data and the musical tune data, and extracts the feature values based on the results of the frequency analysis.

4. The apparatus according to claim 3, wherein the analyzing unit extracts a maximum power value of the noise data and a maximum power value of the musical tune data as the feature values of the noise data and the musical tune data, respectively.

5. The apparatus according to claim 4, wherein, when the feature value of the musical tune data is larger than the feature value of the noise data, the control unit determines that sound of the musical tune data is leaking to the surrounding environment and turns down the playback volume of the musical tune data.

6. The apparatus according to claim 1, wherein the analyzing unit performs a same time waveform analysis on the noise data and the musical tune data, and extracts the feature values based on results of the time waveform analysis.

7. The apparatus according to claim 1, wherein the analyzing unit performs a same frequency analysis and a same time waveform analysis on the noise data and the musical tune data, and extracts the feature values of the noise data and the musical tune data based on results of the frequency analysis and the time waveform analysis.

8. The apparatus according to claim 1, further comprising:
an audio output unit configured to output the musical tune data reproduced by a playback unit,
wherein the sound collecting unit is provided outside of the audio output unit, and
wherein the analyzing unit estimates a sound leak component of the musical tune data that is output from the audio output unit and leaks to outside of the audio output unit based on a transfer characteristic of the audio output unit and extracts a feature value of the estimated sound leak component of the musical tune data, and
wherein the control unit adjusts the playback volume of the musical tune data based on the feature value of the noise data collected by the sound collecting unit and the feature value of the estimated sound leak component of the musical tune data.

9. The apparatus according to claim 1, further comprising:
an audio output unit configured to output the musical tune data reproduced by a playback unit,
wherein the sound collecting unit is provided inside of the audio output unit, and
wherein the analyzing unit estimates noise data of the surrounding environment from the noise data collected by the sound collecting unit based on a transfer characteristic of the audio output unit and extracts a feature value of the estimated noise data of the surrounding environment, and the analyzing unit estimates a sound leak component of the musical tune data that is output from the audio output unit and leaks to outside of the audio output unit based on the transfer characteristic of the audio output unit and extracts a feature value of the estimated sound leak component of the musical tune data, and wherein the control unit adjusts the playback volume of the musical tune data based on the feature value of a signal component of the estimated noise data of the surrounding environment and the feature value of the estimated sound leak component of the musical tune data.

10. The apparatus according to claim 1, further comprising:

a noise reducing unit configured to reduce a noise level of the noise data collected by the sound collecting unit; and an equivalent filter having an effect equivalent to a noise reduction effect offered by the noise reducing unit, wherein the analyzing unit extracts the feature value of the noise data when the noise level is reduced by applying the equivalent filter onto the noise data collected by the sound collecting unit, and wherein the control unit adjusts the playback volume of the musical tune data based on the feature value of the noise-level reduced noise data and the feature value of the musical tune data.

11. The apparatus according to claim 1, further comprising:

a measurement control unit configured to measure volume of the supplied musical tune data and determines an appropriate volume of the musical tune data based on the measured volume of the musical tune data and a previously set threshold regarding the volume of the musical tune data, wherein, when the measured volume of the musical tune data does not exceed the threshold, the measurement control unit controls the analyzing unit to extract the feature values of the noise data and the musical tune data.

12. The apparatus according to claim 1, further comprising:

a combining unit configured to subtract the supplied musical tune data from the noise data collected by the sound collecting unit, wherein the analyzing unit extracts the feature value of the noise data based on the output from the combining unit.

* * * * *